United States Patent
Nasu et al.

(10) Patent No.: US 6,856,475 B2
(45) Date of Patent: Feb. 15, 2005

(54) OPTICAL MODULE HAVING TEMPERATURE ADJUSTMENT FEATURES

(75) Inventors: Hideyuki Nasu, Tokyo (JP); Takehiko Nomura, Tokyo (JP); Tatsuhiko Ueki, Tokyo (JP); Mamoru Shimada, Tokyo (JP)

(73) Assignee: The Furukawa Electric Co., LTD, Tokyo (JP)

( * ) Notice: Subject to any disclaimer, the term of this patent is extended or adjusted under 35 U.S.C. 154(b) by 0 days.

(21) Appl. No.: 10/284,171

(22) Filed: Oct. 31, 2002

(65) Prior Publication Data

US 2003/0095346 A1 May 22, 2003

(30) Foreign Application Priority Data

Oct. 31, 2001 (JP) ........................................ 2001-334963
Nov. 26, 2001 (JP) ........................................ 2001-359505

(51) Int. Cl.⁷ .............................. G02B 7/02; H02S 3/04
(52) U.S. Cl. ............................ 359/820; 372/36; 372/34
(58) Field of Search .......................... 359/820; 372/20, 372/29.02, 32, 34, 36, 38.01, 38.02

(56) References Cited

U.S. PATENT DOCUMENTS

| | | | | |
|---|---|---|---|---|
| 4,690,528 A | * | 9/1987 | Tanimoto et al. | 353/101 |
| 5,446,750 A | * | 8/1995 | Ohtsuka et al. | 372/34 |
| 6,313,941 B1 | * | 11/2001 | Suzuki et al. | 359/337 |
| 6,422,730 B1 | * | 7/2002 | Koren et al. | 362/580 |
| 2002/0012369 A1 | * | 1/2002 | Nasu et al. | 372/36 |
| 2002/0126717 A1 | * | 9/2002 | Nasu et al. | 372/32 |
| 2002/0186729 A1 | * | 12/2002 | Nasu et al. | 372/34 |
| 2003/0039279 A1 | * | 2/2003 | Nasu et al. | 372/36 |
| 2003/0043865 A1 | * | 3/2003 | Nasu et al. | 372/32 |
| 2003/0044132 A1 | * | 3/2003 | Nasu et al. | 385/92 |
| 2003/0053169 A1 | * | 3/2003 | Nasu et al. | 359/133 |
| 2003/0058907 A1 | * | 3/2003 | Nasu et al. | 372/34 |
| 2003/0067949 A1 | * | 4/2003 | Nasu et al. | 372/32 |
| 2003/0081309 A1 | * | 5/2003 | Nishi et al. | 359/337.2 |
| 2003/0112500 A1 | * | 6/2003 | Miki et al. | 359/344 |

FOREIGN PATENT DOCUMENTS

JP 2000-56185 2/2000

* cited by examiner

Primary Examiner—Ricky Mack
(74) Attorney, Agent, or Firm—Oblon, Spivak, McClelland, Maier & Neustadt, P.C.

(57) ABSTRACT

An optical module of the present invention can stabilize e.g. the temperature of a wavelength monitor portion so that the oscillating wavelength of a laser diode is stabilized. The laser diode and the wavelength monitor portion for monitoring the wavelength of the laser diode are included in a package, and are mounted onto a thermo module. The wavelength monitor portion comprise at least an optical filter positioned to receive and filter at least a component of the laser beam and a light receiving device to receive the filtered light through the optical filter and monitor a wavelength of the laser beam. A heat shield member for reducing heat transmission from the package to the wavelength monitor portion is arranged in at least one portion of a peripheral area of the wavelength monitor portion.

15 Claims, 21 Drawing Sheets

OPTICAL MODULE HAVING TEMPERATURE ADJUSTMENT FEATURES

BACKGROUND OF THE INVENTION

In recent years, a laser module (semiconductor laser module) having a laser diode (semiconductor laser) is variously developed in an optical communication field. For example, the laser diode is an optical component used in large quantities as a light source for a signal and a pumping light source for an optical amplifier. The laser module is an optical module in which a laser beam from the laser diode is optically coupled to an optical fiber.

In FIG. 19, one example of the laser module is shown by a YZ cross-section along its optical axis Z-direction. The laser module shown in FIG. 19 has a package 26, a thermo module 5 stored into this package 26, and a base 1 mounted to this thermo module 5.

A laser diode 3, a heat sink 24, lenses 2, 4, a photodiode 7 and a photodiode fixing portion 22 are mounted onto the base 1. Each of these elements mounted onto the base 1, and the base 1 are cooled elements cooled by the thermo module 5 as a temperature adjuster.

The thermo module 5 has a cooling side substrate 17 as a cooling portion, and a heating side substrate 18 arranged oppositely to this cooling side substrate 17. Plural peltier devices are spaced from each other between the cooling side substrate 17 and the heating side substrate 18.

A ferrule 49 held by a sleeve 48 is fixed to one end side of the package 26. A connecting end face side of the optical fiber 50 for optical transmission is inserted and fixed to this ferrule 49. Light outputted from one end 30 side of the laser diode 3 is incident to the optical fiber 50 for optical transmission through the lens 2, and is supplied in a predetermined desirable use through the optical fiber 50.

Light outputted from the other end 31 side of the laser diode 3 is incident to the photodiode 7 through the lens 4. The photodiode 7 functions as a monitor portion for monitoring the intensity of received light.

Since heat is generated from the laser diode 3 driven, the laser diode 3 is cooled by the thermo module 5. The above cooled elements on the thermo module 5, i.e., the base 1 and plural elements arranged on the base 1 are cooled simultaneously.

An unillustrated thermistor for LD is arranged in the vicinity of the laser diode 3. The cooling operation using the thermo module 5 is performed on the basis of a detecting temperature of the thermistor for LD. Namely, the cooling side substrate 17 of the thermo module 5 is cooled and the temperature of the laser diode 3 is held at a preset temperature by controlling an electric current flowed to the thermo module 5 such that the detecting temperature of the thermistor for LD is set to the preset temperature.

The laser diode 3 is an optical component having a temperature dependent property. Namely, an oscillating wavelength from the laser diode 3 depends on the temperature. Holding the temperature of the laser diode 3 at the preset temperature as mentioned above stabilizes the oscillating wavelength of the laser diode 3.

Recently, dense wavelength division multiplexing transmission has been vigorously considered in the optical communication field. The wavelength division multiplexing transmission is a transmission system for transmitting plural multiplexed optical signals through one optical fiber. A laser module stabilized for a long period with respect to the wavelength of the optical signal has been strongly required to apply the laser module to this wavelength multiplexing transmission system.

The laser module having a wavelength monitor for stabilizing the oscillating wavelength from the laser diode was proposed in Japanese Patent Laid-Open No. 2000-56185 to satisfy the above requirement. This laser module is constructed by arranging a wavelength filter, a photodiode for wavelength control, a peltier device, etc. as shown below.

Namely, in this proposed laser module, for example, as shown in FIG. 20, the laser diode 3 is arranged within the package 26, and a wavelength monitor portion 13 arranged on the other end 31 side of-this laser diode 3 monitors the oscillating wavelength of the laser diode 3. The wavelength monitor portion 13 has a beam splitter 35, an optical filter 6 for selectively transmitting the preset wavelength, and a photodiode 7 (7a, 7b). The optical filter 6 is formed by an Etalon filter, etc. The optical filter 6 is an optical component having the temperature dependent property. Accordingly, the wavelength monitor portion 13 is also an optical component having the temperature dependent property.

The laser diode 3 is arranged on the base 11. This base 11 and the base 1 of the wavelength monitor portion 13 are mounted onto the thermo module 5 for making the temperature adjustment of the wavelength monitor portion 13 and the temperature adjustment of the laser diode 3.

Similar to the laser module shown in FIG. 19, a ferrule 49 held by a sleeve 48 is also fixed to one end side of the package 26 in this optical module. The connecting end face side of an optical fiber 50 for optical transmission is inserted and fixed to this ferrule 49.

In the construction shown in FIG. 20, light outputted from the other end 31 of the laser diode 3 is changed to collimated light by a lens 4, and is incident to the wavelength monitor portion 13. One portion of the light incident to the wavelength monitor portion 13 is transmitted through a beam splitter 35 as a dividing portion for dividing the laser beam into two lights, and the remaining portions are reflected.

The light reflected on the beam splitter 35 is received by the photodiode 7 (7a), and the light intensity of the laser diode 3 is monitored. Further, the light transmitted through the beam splitter 35 is transmitted through the optical filter 6, and is received by the photodiode 7 (7b) for monitoring the wavelength.

In the optical module shown in FIG. 20, oscillating wavelength control of the laser diode 3 is performed on the basis of light receiving intensity of the photodiode 7 (7a, 7b).

Since heat is generated from the laser diode 3 driven shown in FIG. 20, an operation for cooling the laser diode 3 by the thermo module 5 is performed. The wavelength monitor portion 13 is also cooled by this cooling operation.

The optical transmission characteristics of the optical filter 6 and the oscillating wavelength from the laser diode 3 originally have the temperature dependent property. Therefore, the construction shown in FIG. 20 stabilizes the oscillating wavelength of the laser diode 3 by holding the temperatures of the wavelength monitor portion 13 and the laser diode 3 at the preset temperature as mentioned above.

SUMMARY OF THE INVENTION

The present invention provides the following optical module in one aspect. Namely, the optical module of the present invention comprises:

An optical module comprising:

an optical component having a temperature dependent property;

a temperature adjuster for adjusting the temperature of the optical component a package for including the temperature adjuster and the optical component; and a heat shield member arranged in at least one portion of a peripheral area of said optical component and reducing heat transmitted from said package to said optical component.

BRIEF DESCRIPTION OF THE DRAWINGS

Exemplary embodiments of the invention will now be described in conjunction with drawings in which.

DETAILED DESCRIPTION

In recent years, the wavelength multiplexing of 25 GHz and 12.5 GHz spacing is anticipated to be required in the field of dense wavelength division multiplexing system. In accordance with this consideration, a requirement specification with respect to the oscillating wavelength stability of the laser diode 3 has become strict.

However, in the optical module disclosed in the above Japanese Patent Laid-Open No. 2000-56185, it was really difficult to approximately hold the temperature of the optical filter 6 at a constant temperature. Further, a problem exists in that the oscillating wavelength of the laser diode 3 is drifted and changed as the temperature of the optical filter 6 is changed.

Figure 21:
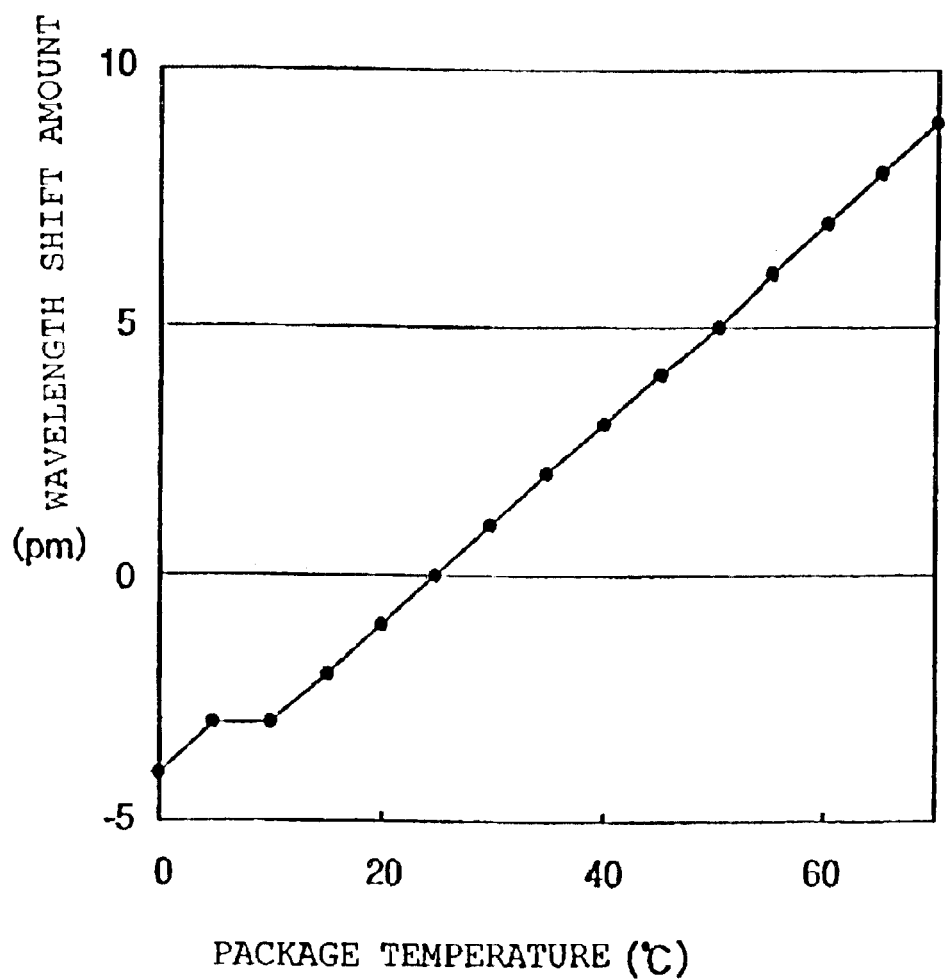
FIG. 21 is a graph showing the package temperature dependent property of the oscillating wavelength outputted from a laser diode in the optical module shown in FIG. 20.

Namely, in the optical module shown in the Japanese Patent Laid-Open No. 2000-56185, for example, the temperature of the optical filter 6 is raised as the temperature of the package 26 is raised. Thus, as shown in FIG. 21, a problem exists in that the wavelength of the laser diode 3 is shifted to the long wavelength side dependently on the temperature of the package 26, and a point for locking the wavelength of the laser diode 3 is shifted to the long wavelength side.

When the oscillating wavelength of the laser diode 3 is thus changed dependently on the temperature of the package 26, it is impossible to satisfy the above requirement. Therefore, it is difficult to apply the optical module to the dense wavelength multiplexing transmission system.

Further, the conventional laser module had the following problem since the temperature of the laser diode 3 was easily raised by receiving heat from the package 26 in addition to heat generated by the laser diode 3 itself. Namely, the quantity of heat that the thermo module 5 must remove from cooled elements including the laser diode 3 increases to hold the laser diode 3 at the preset temperature. Therefore, a problem existed in that power consumption increases.

For example, there is a case in which the heating value of the laser diode 3 is 0.1 W, but heat flowed-in from the package 26 is 1.5 W or more. In such a case, the influence of the heat quantity flowed-in from the package 26 is very large.

In particular, recently, the wavelength of the laser module is tuned by changing the temperature of the laser diode 3.

The temperature control range of the laser diode 3 is widened on the low temperature side on trial to widen a wavelength variable range.

When the temperature of the laser diode 3 is controlled to a low, the heat quantity flowing into the laser diode 3 from the package 26 becomes larger by many times than the heat quantity generated by the laser diode 3. Thus, the quantity of heat of which the thermo module 5 must remove the cooled elements is very increased.

In this case, no laser diode 3 could be set to the preset temperature due to the limit of an endothermic amount (cooling ability) of the thermo module 5 and the laser diode 3 could not be controlled in wide temperature range.

Further, in the construction of the above laser module, the temperature within the package 26 becomes irregular by the heat received from the package 26, and the temperature of the laser diode 3 or the optical filter 6 are not also uniformed. Therefore, there is a temperature difference between the laser diode 3 and the thermistor arranged near this laser diode 3 and detecting the temperature of the laser diode 3 or the temperature of the wavelength monitor portion.

Therefore, the temperature control of the thermo module 5 based on the detecting temperature of the thermistor for LD or a signal from the wavelength monitor portion 13 becomes unstable. Therefore, a problem also existed in that the oscillating wavelength of the laser diode 3 was drifted.

One aspect of the optical module of the present invention is an optical module able to stabilize the temperatures of the wavelength monitor portion, the laser diode, etc. even when the package temperature is changed, thereby being able to stabilize the oscillating wavelength of e.g., the laser diode.

Figure 1:
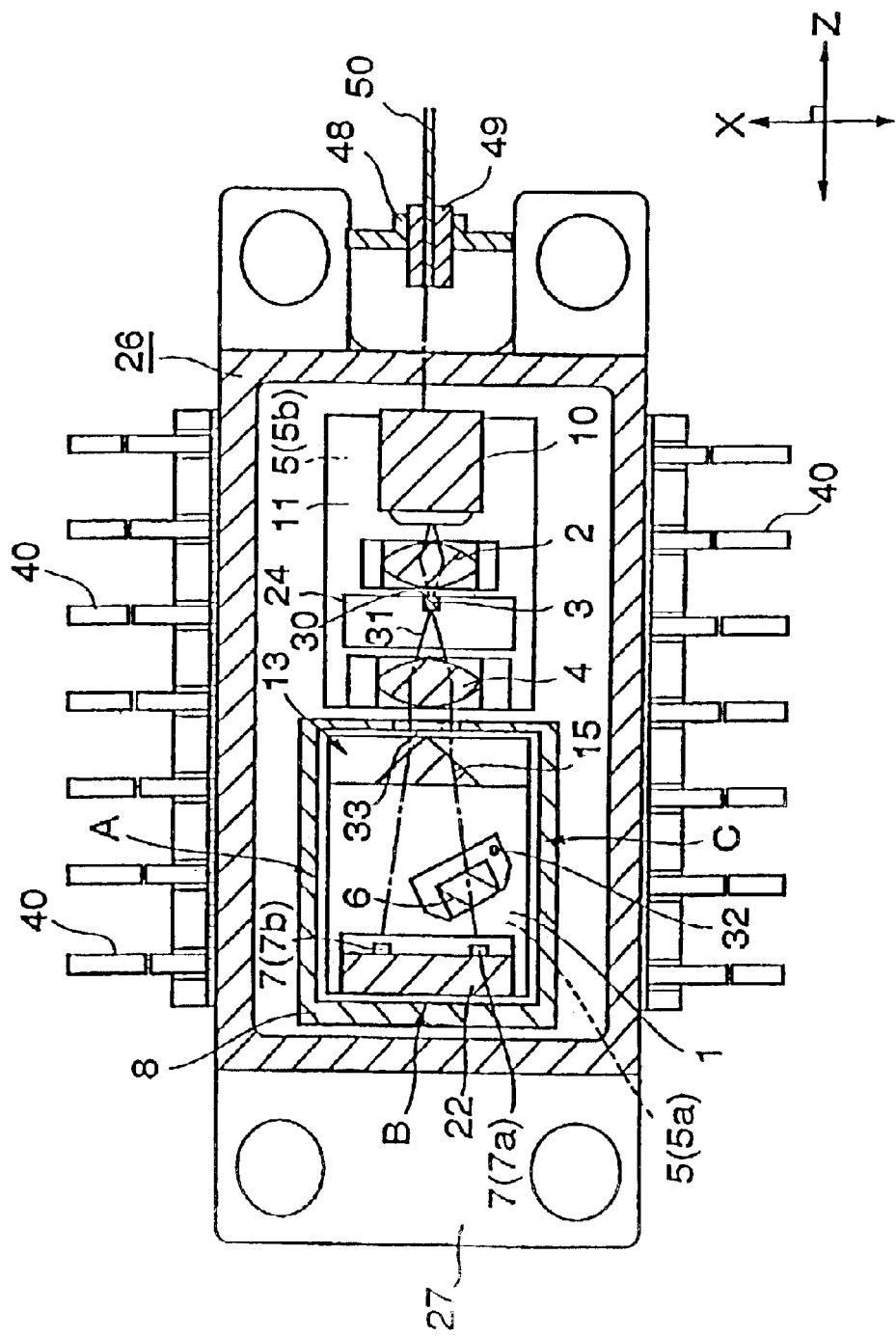
FIG. 1 is an elemental structural view showing a first embodiment of an optical module in the present invention by an XZ cross-section.
Figure 2:
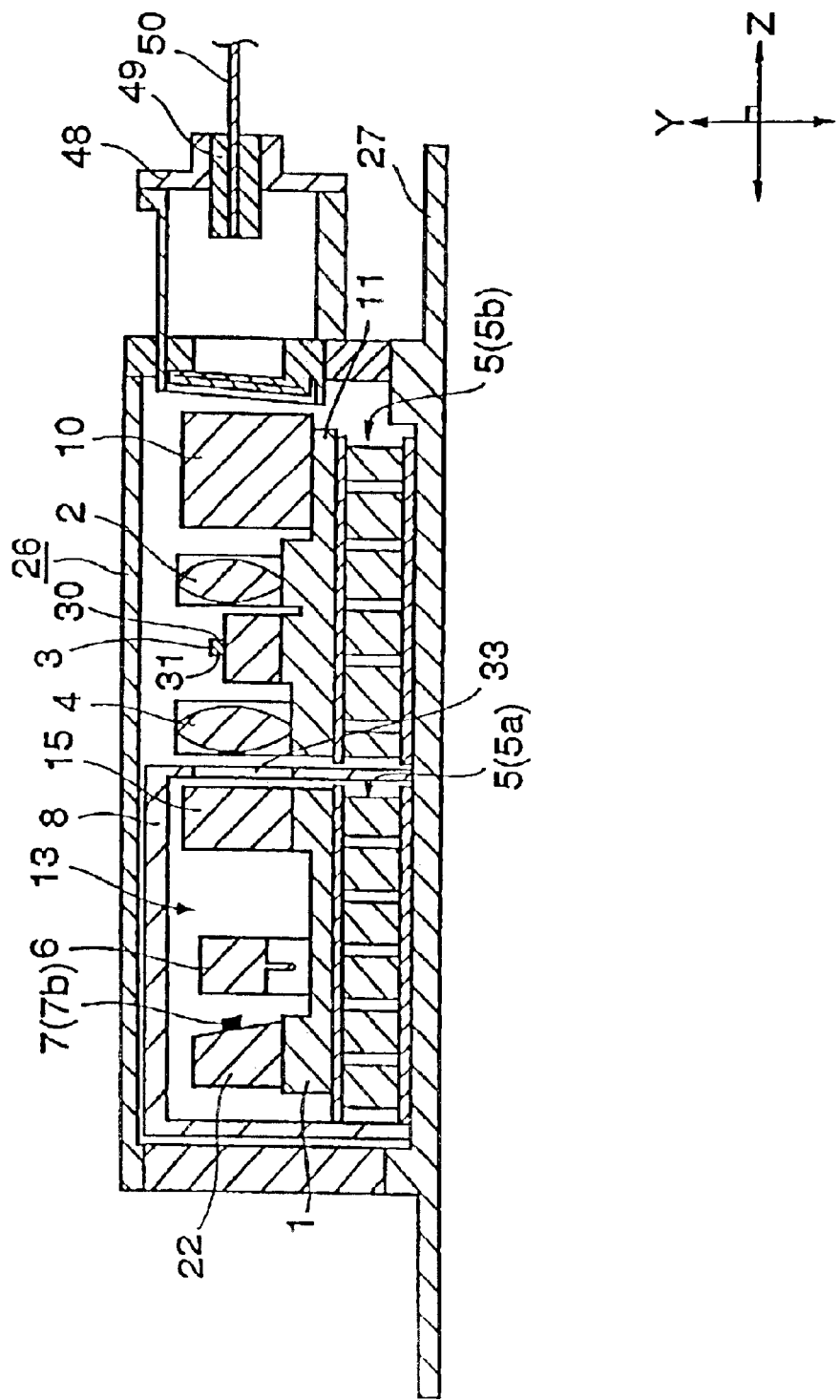
FIG. 2 is an elemental structural view showing the first embodiment of the optical module in the present invention by a YZ cross-section.

The embodiments of the present invention will next be explained with reference to the drawings. In the explanation of the embodiments described below, the same term portions as the conventional example are designated by the same reference numerals and signs, and their overlapping explanations are omitted or simplified. FIGS. 1 and 2 show the main construction of a first embodiment of the optical module in the present invention.

FIG. 1 is a cross-section in which the optical module of the first embodiment is cut in an XZ section along the optical axis Z-direction of the laser diode. FIG. 2 is a cross-section in which this optical module is cut in a YZ section along the optical axis Z-direction of the laser diode.

As shown in these figures, in the optical module of the first embodiment, a wavelength monitor portion 13 and a laser diode 3 are included in a package 26. One portion of a laser beam outputted from this laser diode 3 is incident to the wavelength monitor portion 13. Namely, light outputted from the other end 31 side of the laser diode 3 among the output light of the laser diode 3 is incident to the wavelength monitor portion 13.

Light outputted from one end 30 side of the laser diode 3 is incident to an optical fiber 50 through a lens 2 and an optical isolator 10. Namely, the lens 2 and the optical isolator 10 are an optical coupling element for optically coupling the optical fiber 50 for laser beam transmission and the laser diode 3. A thermistor for a laser for detecting the temperature of the laser diode 3 is arranged in the vicinity of the laser diode 3.

The wavelength monitor portion 13 is mounted onto a thermo module 5 (5a) as a temperature adjuster for adjusting the temperature of the wavelength monitor portion 13 through a base 1. The laser diode 3 is mounted onto the thermo module 5 (5b) as a temperature adjuster for adjusting the temperature of the laser diode through a base 11 and a heat sink 24.

The wavelength monitor portion 13 has a prism 15 and an optical filter 6. The prism 15 functions as an optical divider for dividing an incident laser beam into two or more (here two) lights. The optical filter 6 receives at least one portion of the lights divided by the prism 15, and transmits the light of a preset wavelength therethrough. The optical filter 6 is e.g., an Etalon filter, etc. A thermistor 32 for a filter is arranged in the vicinity of the optical filter 6 to detect the temperature of the optical filter 6.

The wavelength monitor portion 13 has a photodiode 7 (7a). This photodiode 7 (7a) is a light receiving device (first light receiving device) for receiving the light transmitted through the optical filter 6.

The wavelength monitor portion 13 also has a photodiode 7 (7b). The photodiode 7b functions as a second light receiving device for directly receiving the other light divided by the prism. These photodiodes (7a, 7b) are fixed onto the member 22.

The optical module of the first embodiment is characterized in that a heat shield member 8 reduces heat transmission from the package 26 to the wavelength monitor portion 13 side is arranged in covering the wavelength monitor portion 13 and the thermo module 5 (5a). The heat shield member 8 is formed with a heat insulating material consist of a porous ceramic plate of 0.5 mm in thickness.

The forming material of the heat shield member 8 is not particularly limited. As an example of the heat shield member 8 of the heat insulating material, there are a ceramic fiber such as ceramic wool, a glass fiber, lock wool, foaming cement, hollow glass beads, foaming urethane, foaming polystyrene, porous ceramic, etc. When the heat shield member 8 is formed with a metal, the effect of uniformity of temperature is obtained.

An opening portion 33 for transmitting the laser beam therethrough is formed in the heat shield member 8. Further, an unillustrated opening portion for extending an unillustrated electric wire therethrough is also formed in the heat shield member 8. The electric wire connects a lead terminal 40 shown in FIG. 1 to the laser diode 3, the photodiode 7, the thermistor, etc.

Since it is preferable to form these opening portions so as to be smaller, the opening portions are formed so as to be small as much as possible. In FIGS. 1 and 2 and each of figures shown below, a wiring pattern within the package 26 is omitted.

In the first embodiment, heat transmission from the package 26 to the wavelength monitor portion 13 is reduced by arranged the heat shield member 8, and convection, radiation and conductivity can be restrained in an arranging area of the wavelength monitor portion 13. Therefore, in the first embodiment, the temperature of the wavelength monitor portion 13 is uniformed, and the influence due to the temperature of the package 26 can be restrained. Accordingly, in the first embodiment, the oscillating wavelength of the laser diode 3 can be stabilized based on the signal outputted from the wavelength monitor portion 13 so that the optical module of high reliability can be realized.

Further, in accordance with the first embodiment, since the heat transmission from the package 26 to the wavelength monitor portion 13 can be reduced by arranged the heat shield member 8, the heat quantity for cooling the wavelength monitor portion 13 by the thermo module 5 (5a) can be reduced. As this result, in the first embodiment, electric power consumption of the thermo module 5 (5a) can be reduced and cost can be reduced.

Further, in accordance with the first embodiment, the thermistor 32 for a filter is arranged in the vicinity of the optical filter 6. Since the inside of the heat shield member 8 can be uniformed by arranging the heat shield member 8 as mentioned above, the temperature of the optical filter 6 can be more precisely controlled on the basis of the detecting temperature of the thermistor 32 for a filter. Accordingly, in accordance with the first embodiment, the oscillating wavelength of the laser diode 3 can be more precisely stabilized.

Further, in the first embodiment, since the thermo modules 5a, 5b are individually arranged to adjust the temperature of the wavelength monitor portion 13 and the temperature of the laser diode 3, the temperature adjustment of the wavelength monitor portion 13 and the temperature adjustment of the laser diode 3 can be more finely made.

Figure 3:
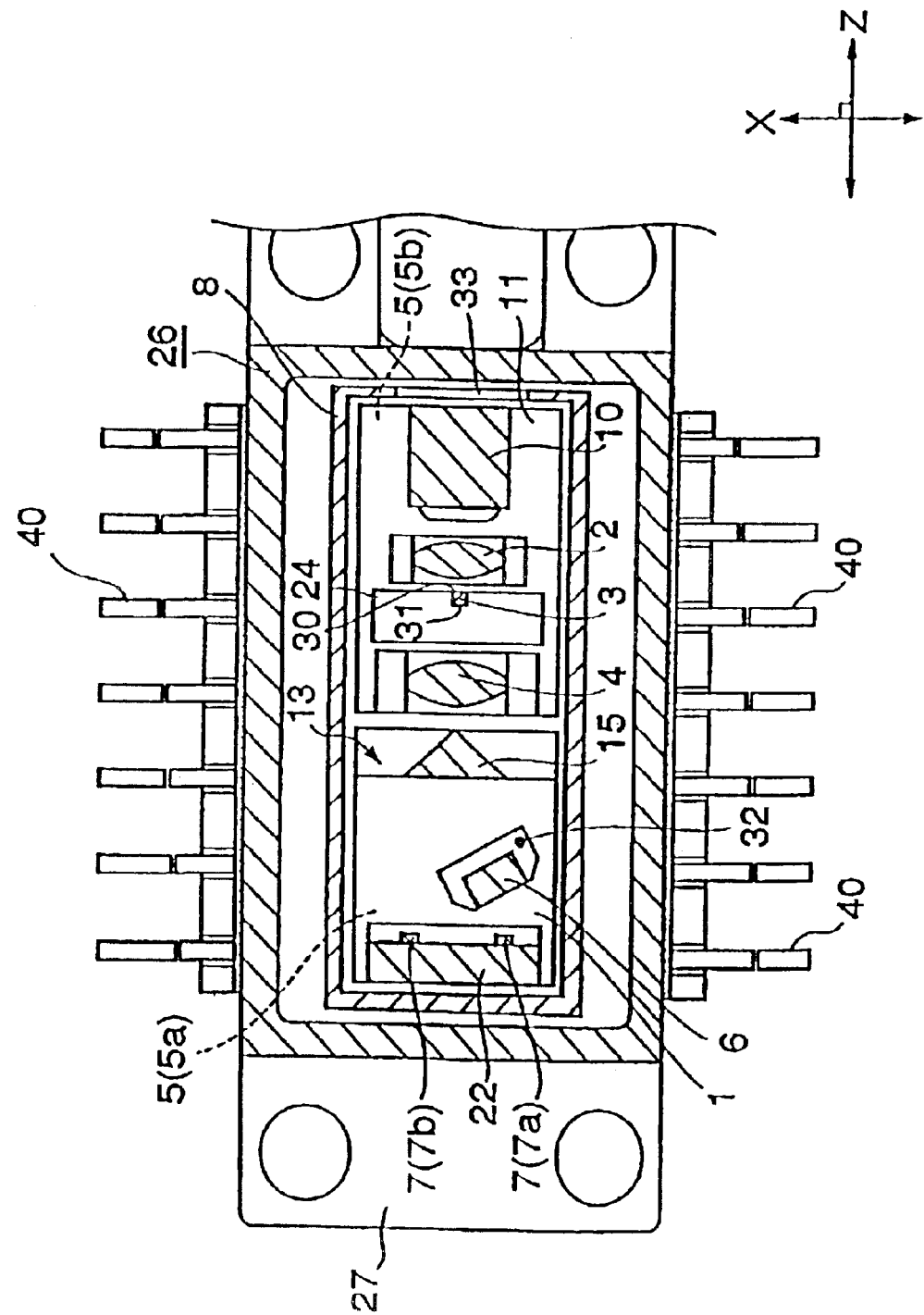
FIG. 3 is an elemental structural view showing a second embodiment of the optical module in the present invention by the XZ cross-section.
Figure 4:
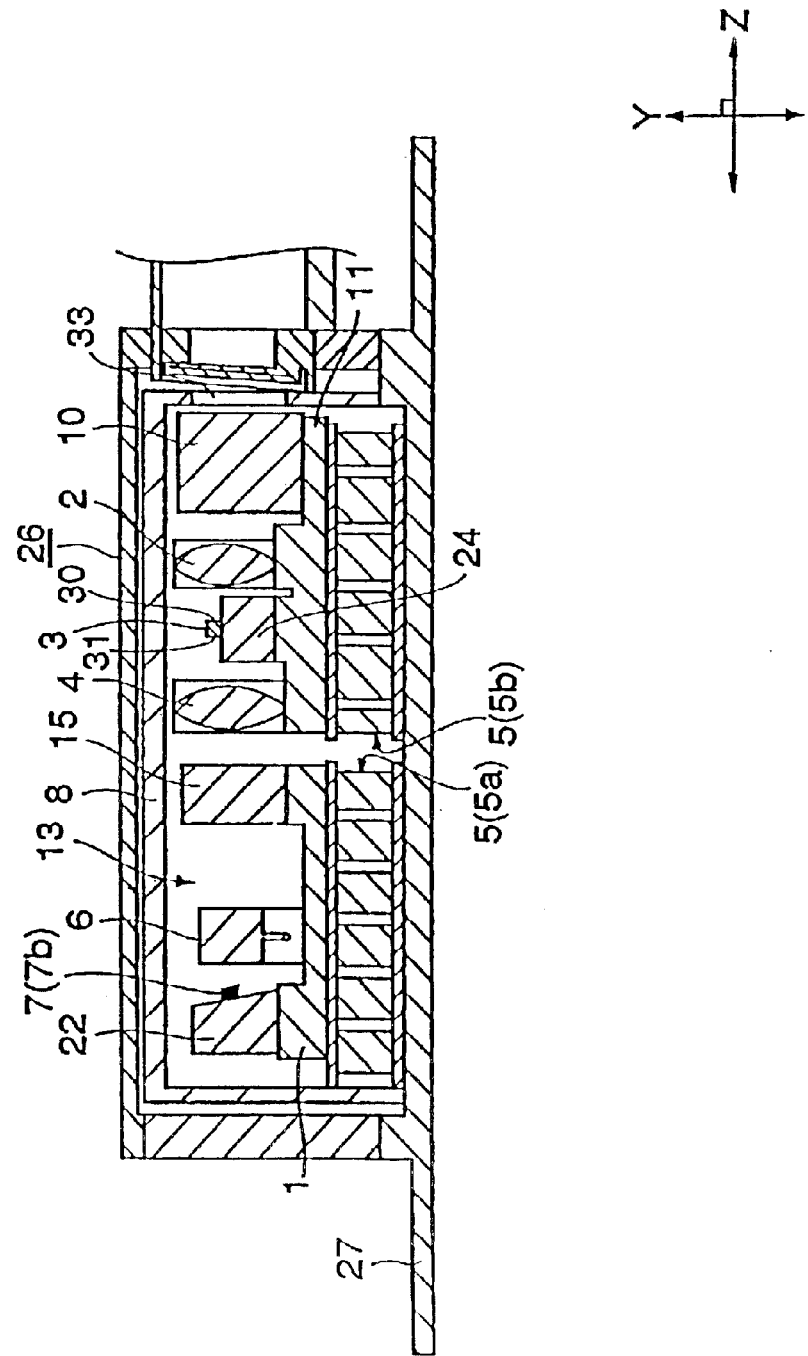
FIG. 4 is an elemental structural view showing the second embodiment of the optical module in the present invention by the YZ cross-section.

FIG. 3 shows a second embodiment of the optical module in the present invention by an XZ cross-section. FIG. 4 shows a YZ cross-section of this optical module. The second embodiment is constructed approximately similarly to the first embodiment. In the explanation of the second embodiment, the same term portions as the first embodiment are designated by the same reference numerals and signs, and their overlapping explanations are omitted.

The second embodiment characteristically differs from the first embodiment in that the heat shield member 8 is arranged in a mode for entirely covering the thermo module 5 (5a, 5b) and plural elements (cooled elements) mounted onto the thermo module 5 (5a, 5b). The heat shield member 8 is arranged in spacing from the package 26. Accordingly, heat transmitted from the package 26 to the cooled elements is reduced.

Namely, in the second embodiment, the heat transmitted from the package 26 to the cooled elements is reduced and convection, radiation and conductivity in the arranging area of the cooled elements can be restrained by arranging the heat shield member 8 in the mode for covering the entire cooled elements. Accordingly, heat quantity cooled by the thermo module 5 (5b) can be reduced. As this result, electric power consumption of the thermo module 5 (5b) can be reduced and cost can be reduced.

Further, in the second embodiment, since the inside of the heat shield member 8 can be uniformed by arranging the heat shield member 8, the temperature difference between the laser diode 3 and the thermistor for LD arranged in a position near the laser diode 3 can be reduced. Accordingly, in the second embodiment, the operation of the thermo module 5 (5b) based on the detecting temperature of the thermistor for LD can be precisely controlled so that the optical module having a stable oscillating wavelength can be realized.

Figure 5:
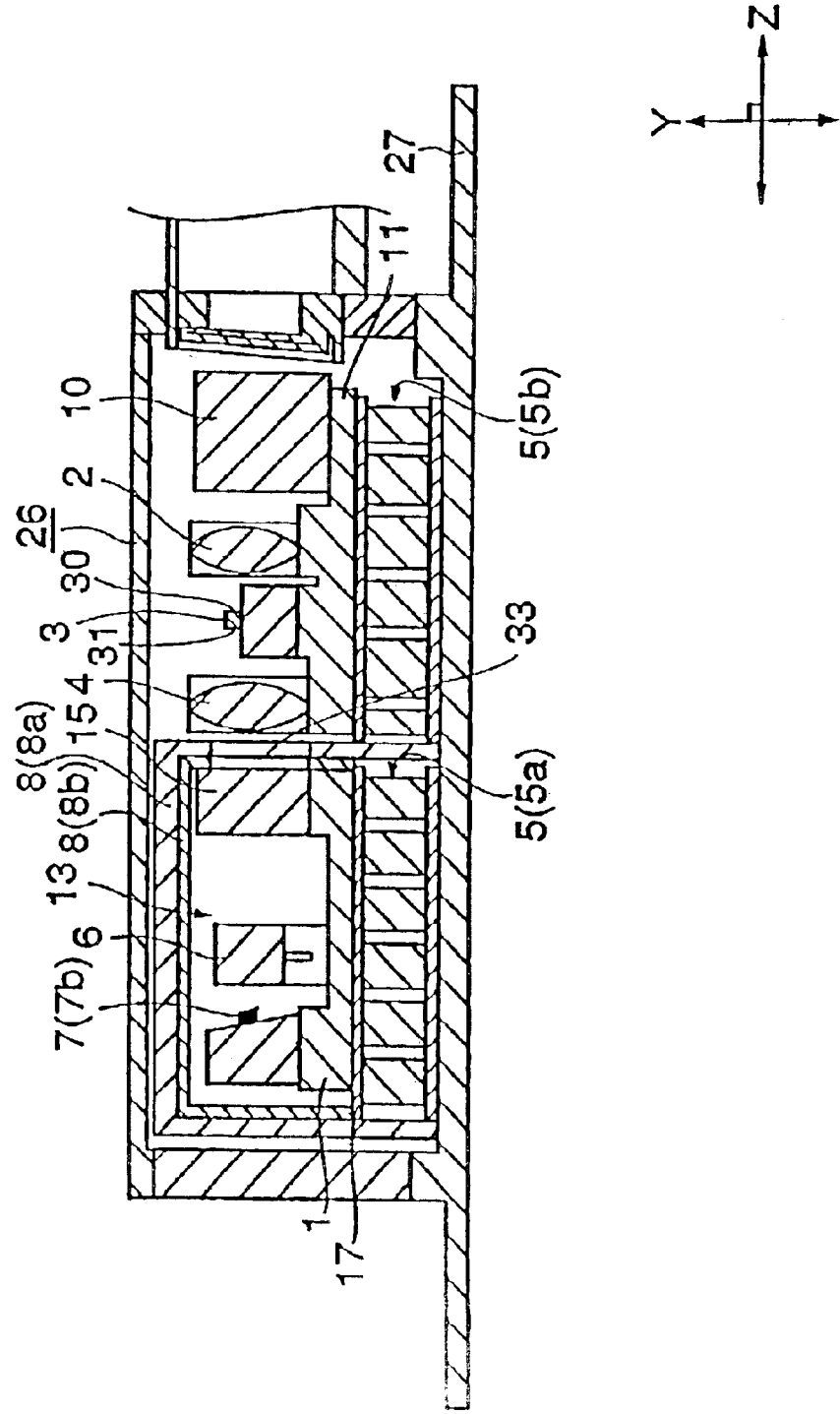
FIG. 5 is an elemental structural view showing a third embodiment of the optical module in the present invention by the YZ cross-section.

FIG. 5 shows a third embodiment of the optical module in the present invention by a YZ cross-section. The third embodiment is constructed approximately similarly to the first embodiment. In the explanation of the third embodiment, the same term portions as the first embodiment are designated by the same reference numerals and signs, and their overlapping explanations are omitted.

The third embodiment characteristically differs from the first embodiment in that plural (here two) heat shield members 8 are arranged, and the wavelength monitor portion 13 is doubly (two layers) covered with the heat shield members 8 (8a, 8b). The outside heat shield member 8 (8a) is formed with a heat insulating material, and the inside heat shield member 8 (8b) is formed with a heat conduction material. No space is approximately formed between these heat shield members 8 (8a) and 8 (8b).

The outside heat shield member 8 (8a) contacts with a cooling side substrate 17 of the thermo module 5 (5a) and is fixed onto this cooling side substrate 17, and is arranged in thermally no contact with package 26. For example, a metal such as a copper-tungsten plate, having about 200 W/m·K in coefficient of thermal conductivity is applied to a heat conduction material for forming the heat shield member 8 (8b).

The third embodiment is constructed as mentioned above, and effects similar to those in the first embodiment can be also obtained in the third embodiment.

Further, in the third embodiment, the heat shield member 8b is formed by a metal having a high coefficient of thermal conductivity, and is arranged in a mode in which the heat shield member 8b comes in contact with the base 1 and the cooling side substrate 17 of the thermo module 5a, and does not come in contact with the package 26. Therefore, in the third embodiment, the heat shield member 8b can be also efficiently cooled together with the base 1 when the thermo module 5 is operated.

Namely, in the third embodiment, the cooled elements on the base 1 are included in a space formed by the base 1 and the heat shield member 8b cooled by the thermo module 5a. In the third embodiment, since the wavelength monitor portion 13 is doubly covered with the heat shield members 8a, 8b and the inside of this area can be further uniformed, the oscillating wavelength of the laser diode 3 can be more reliably stabilized.

Figure 6:
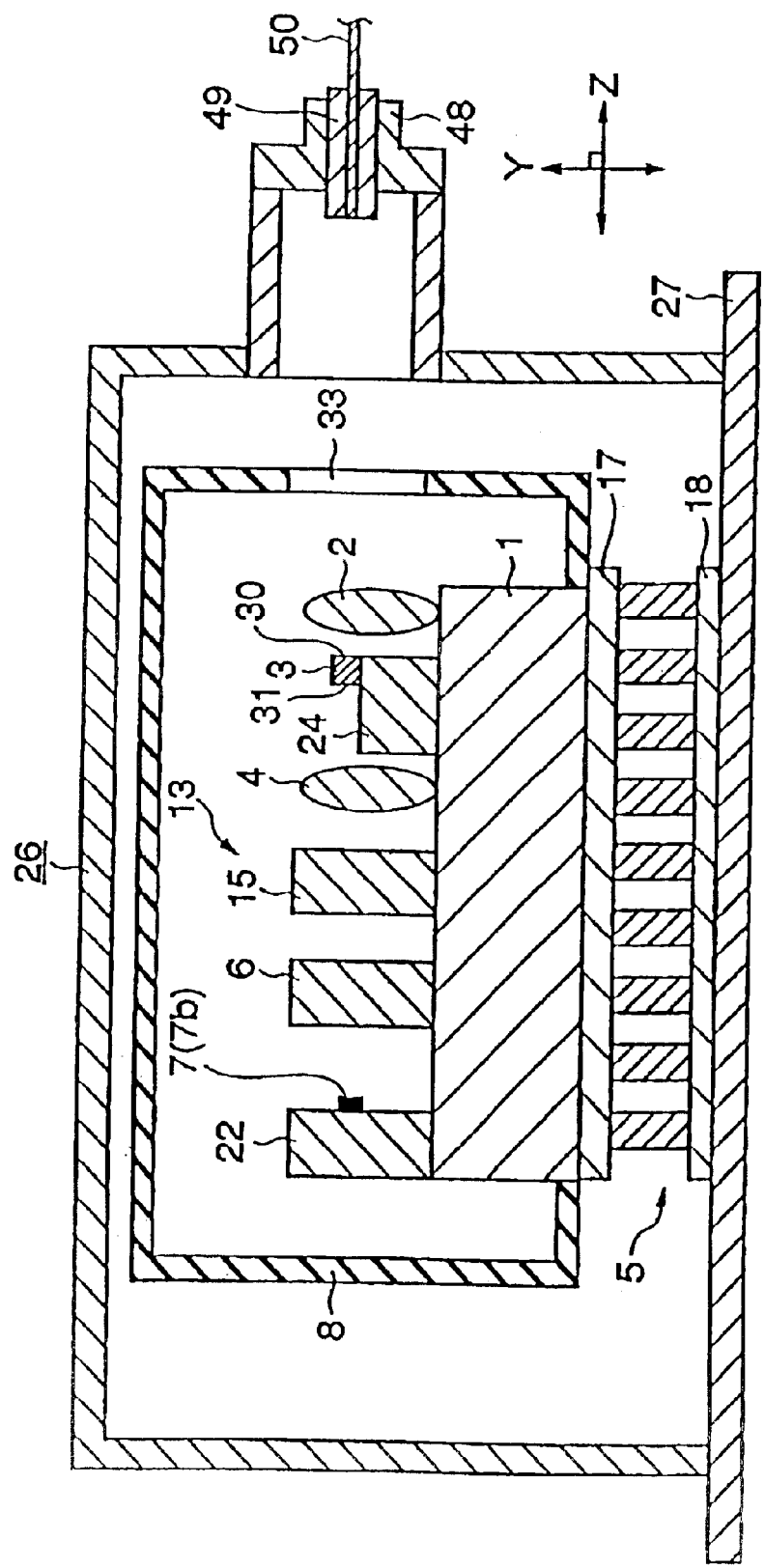
FIG. 6 is an elemental structural view showing each of fourth and fifth embodiments of the optical module in the present invention by the YZ cross-section.
Figure 7:
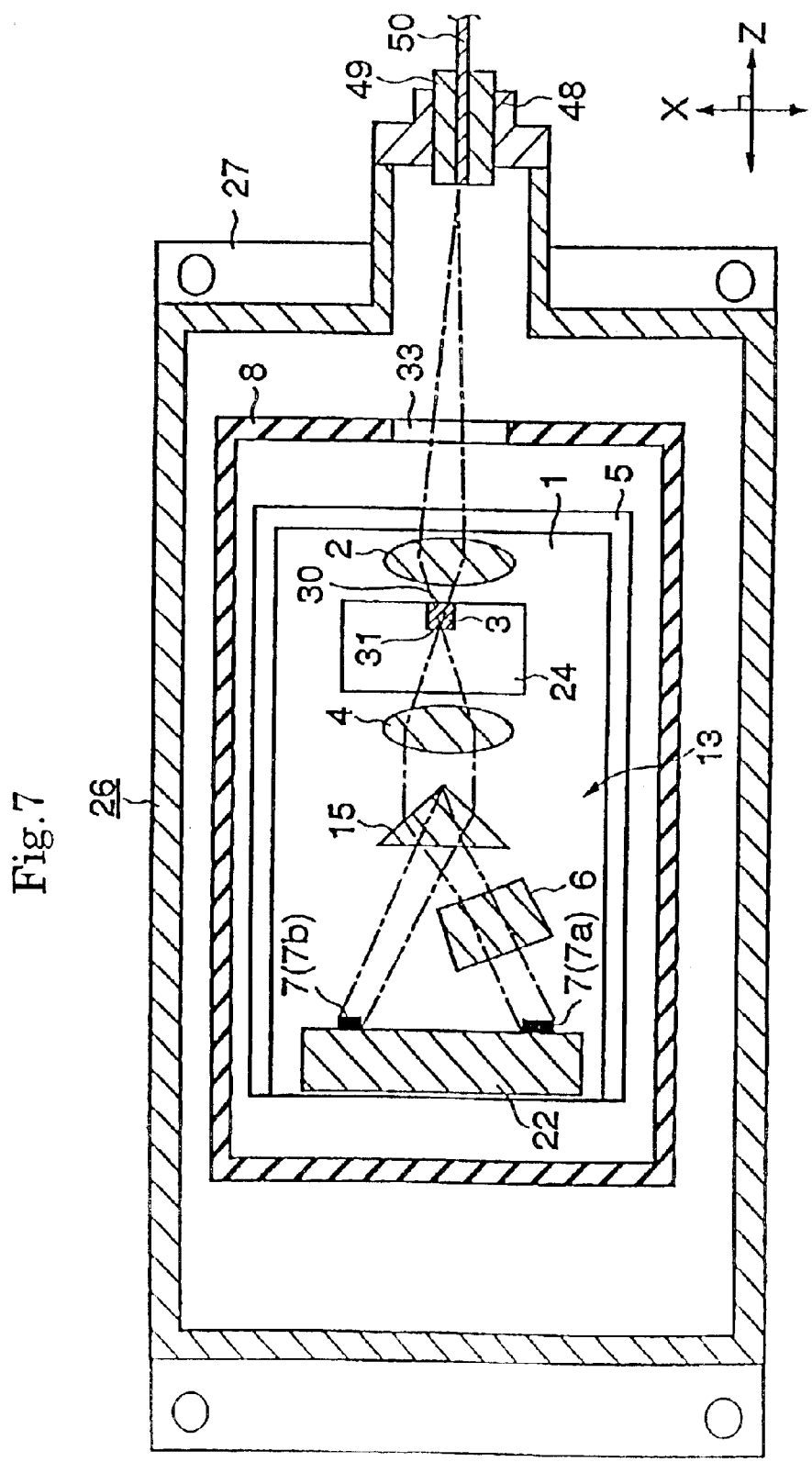
FIG. 7 is an elemental structural view showing each of the fourth and fifth embodiments of the optical module in the present invention by the XZ cross-section.

FIGS. 6 and 7 show a fourth embodiment of the optical module in the present invention. FIG. 6 is a cross-section in which the optical module having a wavelength monitor function is cut in a YZ cross-section along the optical axis Z-direction of the laser diode. FIG. 7 is an XZ cross-section along the optical axis Z-direction of the laser diode of this optical module.

The fourth embodiment is constructed approximately similarly to the second embodiment. One of characteristics of the fourth embodiment different from those of the second embodiment is that one base 1 and one thermo module 5 are arranged, and all cooled elements of the thermo module 5 except for the base 1 are mounted onto the base 1. The thermo module 5 functions as a temperature adjuster of both the laser diode 3 and the wavelength monitor portion 13. In the fourth embodiment, an optical isolator 10 is omitted.

Similar to the second embodiments, a thermistor for a filter is arranged in the vicinity of the optical filter 6 in the fourth embodiment although this thermistor is not shown in FIGS. 6 and 7.

In the fourth embodiment, at least one portion (here both end sides) of the heat shield member 8 thermally contacts with the base 1 as one cooled element and the cooling side substrate 17 as a cooling portion of the thermo module 5. The material of the heat shield member 8 is not particularly limited, but the heat shield member 8 can be formed with e.g., a metal as a heat conduction material. In the fourth embodiment, the heat shield member 8 is formed by a copper-tungsten plate of about 200 W/m·K in coefficient of thermal conductivity.

In the fourth embodiment, as mentioned above, the heat shield member 8 is formed with a metal having a high coefficient of thermal conductivity, and is arranged in contact with the base 1 and the cooling side substrate 17 of the thermo module 5. Thus, the heat shield member 8 can be also cooled together with the base 1 when the thermo module 5 is operated.

Accordingly, the cooled elements on the base 1 attain a state in which the cooled elements are included in a space formed by the base 1 and the heat shield member 8 cooled by the thermo module 5. Namely, the inside space is held under the atmosphere of a low temperature in comparison with the outside temperature of the heat shield member 8, and the inside covered with the heat shield member 8 can be further uniformed.

The fourth embodiment is constructed as mentioned above, and effects similar to those in the second embodiment can be also obtained in the fourth embodiment. Further, in the fourth embodiment, temperature stability within the heat shield member 8 can be set to be very preferable by applying the heat shield member 8 having a preferable heat conduction property, and arranging the heat shield member 8 in contact with the low temperature side substrate 17 of the thermo module 5.

For example, in the fourth embodiment, the ambient temperature of the optical module is really set to 70° C., and the temperature (detecting temperature of the thermistor for LD) of an arranging area of the laser diode 3 is controlled to −15° C. As this result, the temperature deviation inside of the arranging area of the laser diode 3 and the arranging area of the optical filter 6 of the wavelength monitor portion 13 could be held at a small temperature of 0.4° C. or less.

In the fourth embodiment, the oscillating wavelength of the laser diode 3 can be very preferably controlled on the basis of monitor information of the wavelength monitor portion 13, and a variable area of the oscillating wavelength of the laser diode 3 can be widened.

A fifth embodiment of the optical module in the present invention will next be explained. The fifth embodiment is constructed approximately similarly to the fourth embodiment, and has the construction shown in each of FIGS. 6 and 7. However, the heat shield member 8 is formed with a heat insulating material in the fifth embodiment. In the fifth embodiment, since the other constructions are similar to those in the fourth embodiment, their overlapping explanations are omitted.

In the fifth embodiment, the heat shield member 8 is formed with a porous ceramic plate of 0.5 mm in thickness. An example of the heat shield member 8 with the heat insulating material arranged in the optical module is given as mentioned above.

The fifth embodiment can also obtain effects approximately similar to those in the fourth embodiment. Further, in the fifth embodiment, the efficiency of a reduction in heat transmission from the package 26 to the cooled element can be preferably shown by forming the heat shield member 8 with a heat insulating material. For example, in the fifth embodiment, electric power consumption of the thermo module 5 could be reduced by 8% at its maximum in comparison with a construction having no heat shield member 8.

The present inventors made an analysis using a thermal simulation with respect to the optical module of the fifth embodiment. It has been then confirmed that there is an effect of the reduction in the electric power consumption of the thermo module 5. In addition to this effect, it has been also confirmed in the fifth embodiment that there is the effect of reducing the temperature of a light emitting portion of the laser diode 3 by 4° C. at its maximum in comparison with a case in which the optical module is formed without arranging the heat shield member 8.

Figure 8:
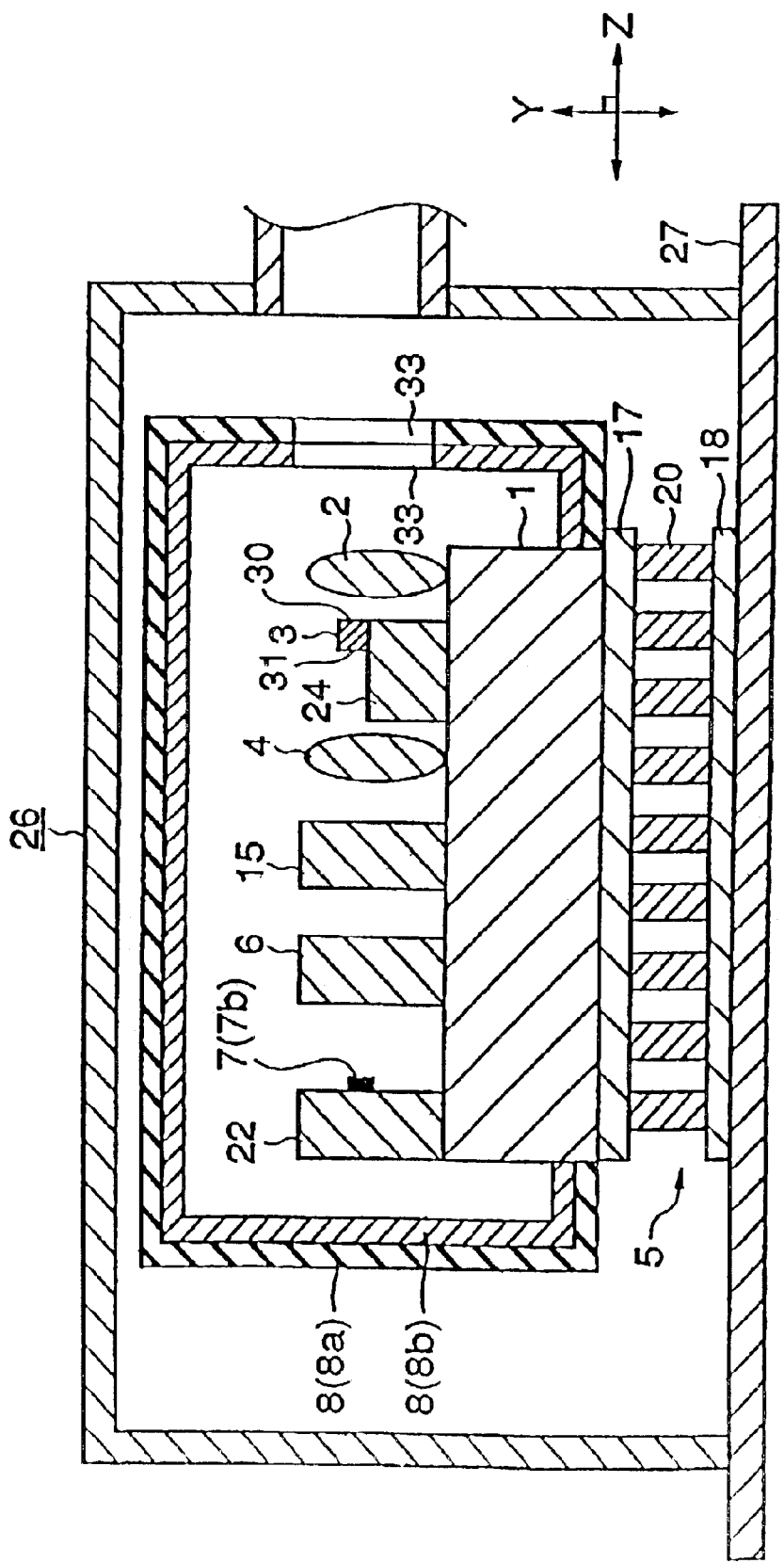
FIG. 8 is an elemental structural view showing a sixth embodiment of the optical module in the present invention by the YZ cross-section.

FIG. 8 shows a sixth embodiment of the optical module in the present invention by a YZ cross-section. The sixth embodiment is constructed approximately similarly to the fourth and fifth embodiments. In the explanation of the sixth embodiment, the same term portions as the fourth and fifth embodiments are designated by the same reference numerals and signs, and their overlapping explanations are omitted.

The sixth embodiment characteristically differs from the fourth and fifth embodiments in that plural (here two) heat shield members 8 are arranged in covering the cooled elements doubly or more. The outside heat shield member 8 (8a) is formed by a heat insulating material, and the inside heat shield member 8 (8b) is formed with a heat conduction material. No space is approximately formed between these heat shield members 8 (8a, 8b).

The sixth embodiment is constructed as mentioned above, and effects similar to those in the fourth and fifth embodiments can be also obtained in the sixth embodiment.

In the sixth embodiment, the heat shield member 8 is arranged in the mode for doubly covering the cooled elements, and heat transmission from the package 26 to the cooled elements can be efficiently reduced by the heat shield member 8a of the outside heat insulating material. Further, in the sixth embodiment, since the heat shield member 8b of the inside heat conduction material can be cooled by the thermo module 5, the arranging area of the cooled elements can be uniformed.

Namely, in the sixth embodiment, the cooled elements can be more efficiently uniformed and reduced in temperature by arranging the heat shield member 8 in the mode for doubly covering the cooled elements. Accordingly, in the sixth embodiment, electric power consumption of the thermo module 5 and cost can be further reduced.

Figure 9:
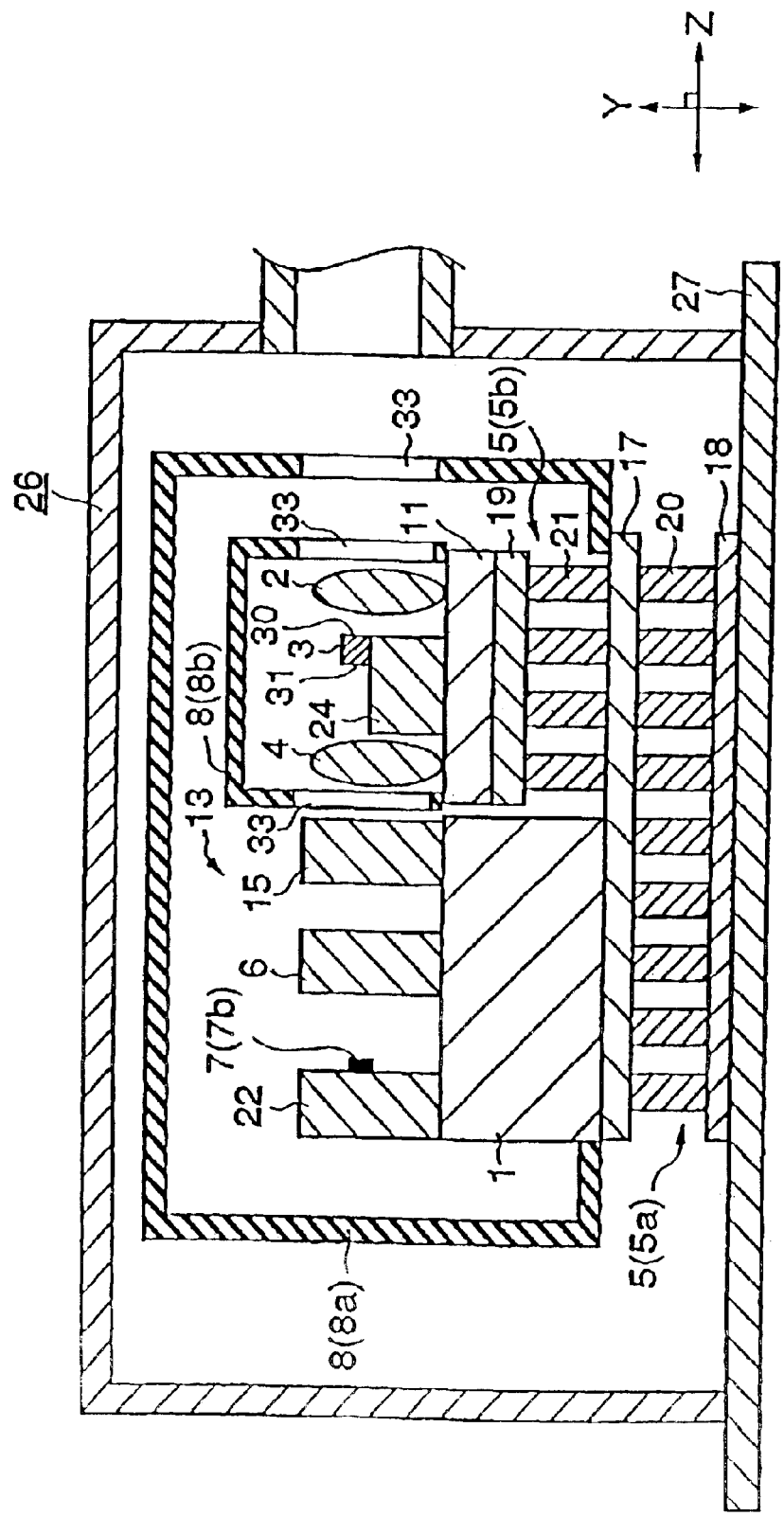
FIG. 9 is an elemental structural view showing a seventh embodiment of the optical module in the present invention by the YZ cross-section.

FIG. 9 shows a seventh embodiment of the optical module in the present invention by a YZ cross-section. In the explanation of the seventh embodiment, the same term portions as each of the embodiments are designated by the same reference numerals and signs, and their overlapping explanations are omitted.

In the optical module of the seventh embodiment, plural (here two) thermo modules 5 (5a, 5b) are arranged in a cascade with two stages to widen a temperature variable range of the laser diode 3. In FIG. 9, reference numerals 19 and 21 respectively designate a cooling side substrate of the thermo module 5b and a peltier device.

In the seventh embodiment, the thermo module 5b is mounted to one end side upper portion of the thermo module 5a. A base 11 is mounted onto the thermo module 5b. A heat sink 24 mounting lenses 2, 4 and the laser diode 3 thereto is mounted onto the base 11. A base 1 is mounted to the other end side upper portion of the thermo module 5a, and the wavelength monitor portion 13 is arranged on the base 1.

Similar to the sixth embodiment, plural heat shield members 8 (8a, 8b) are arranged in the seventh embodiment, and are also arranged in doubly covering the cooled elements. However, in the seventh embodiment, the innermost heat shield member 8b among the plural heat shield members 8 (8a, 8b) covers the area including the laser diode 3, and the heat shield members 8a and 8b are spaced from each other.

The heat shield member 8b is formed with a heat conduction material, and is arranged in contact with the base 11 of the laser diode 3 side. The heat shield member 8a is formed with a heat conduction material, and is arranged in contact with the base 1 and the cooling side substrate 17 as a cooling portion of the thermo module 5a.

The seventh embodiment is constructed as mentioned above, and effects similar to those in the fourth to sixth embodiments can be obtained.

Further, in the seventh embodiment, the laser diode 3 can be more efficiently cooled and the temperature control range of the laser diode 3 can be enlarged by arranged the thermo module 5 (5a, 5b) with two stages.

Further, in the seventh embodiment, the arranging area of the laser diode 3 can be further uniformed and the temperature of the laser diode 3 can be preferably controlled by covering the area including the laser diode 3 with the heat shield member 8b, and covering the entire cooled elements with the heat shield member 8a.

Namely, in the seventh embodiment, since at least one end side (here both end sides) of the heat shield members 8a, 8b is respectively arranged in contact with the cooled elements or the cooling portion of the thermo module 5b at the uppermost stage, cooling efficiency of the cooled elements can be improved and the arranging area of the cooled elements can be uniformed.

Figure 10:
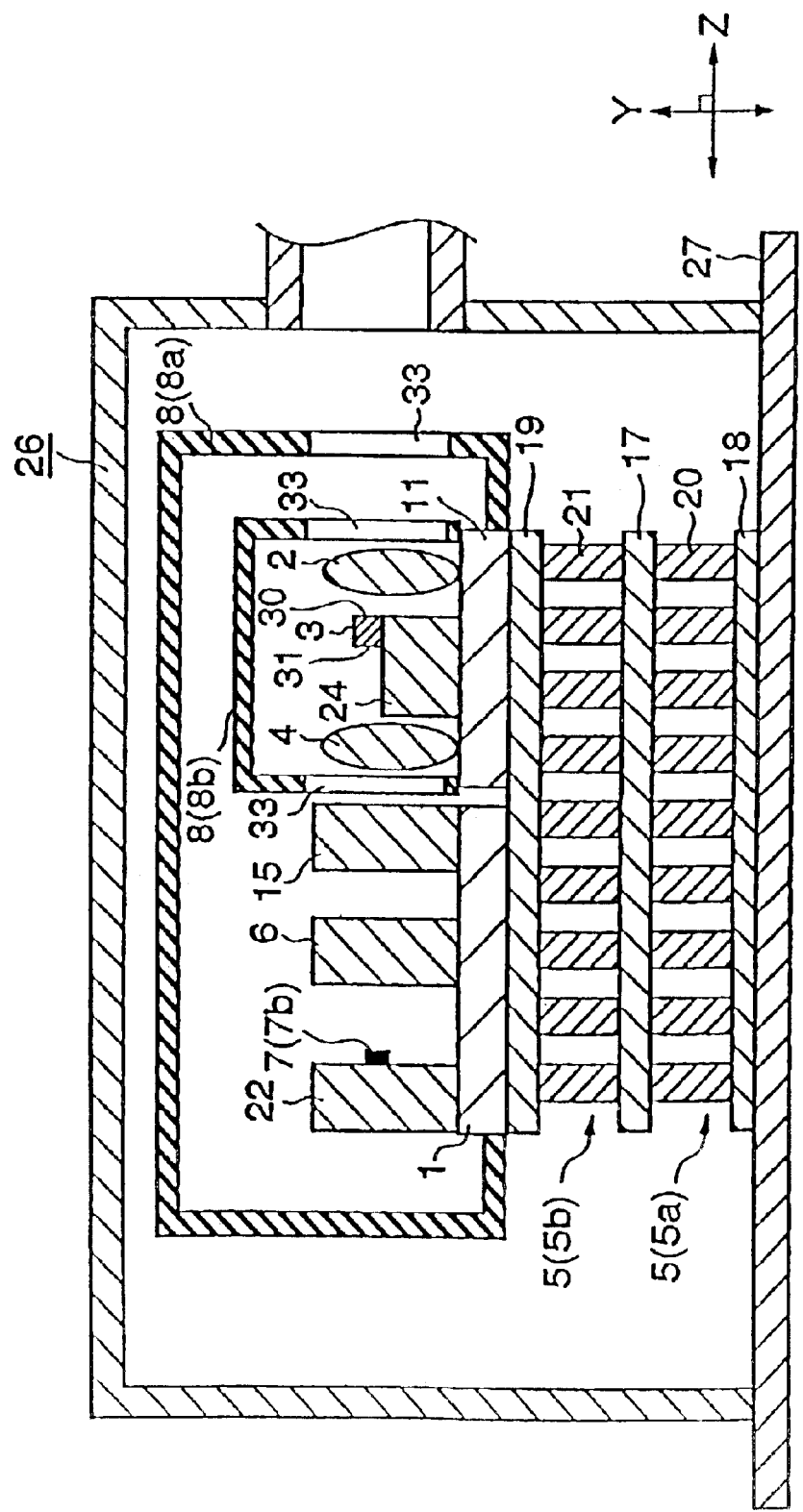
FIG. 10 is an elemental structural view showing an eighth embodiment of the optical module in the present invention by the YZ cross-section.

FIG. 10 shows an eighth embodiment of the optical module in the present invention by a YZ cross-section. In the explanation of the eighth embodiment, the same term portions as each of the above embodiments are designated by the same reference numerals and signs, and their overlapping explanations are omitted.

The eighth embodiment is constructed approximately similarly to the seventh embodiment. The eighth embodiment characteristically differs from the seventh embodiment in that the thermo module 5b is arranged on the entire area of the thermo module 5a, and the heat shield member 8a is arranged in contact with the base 1 and the base 11.

Since the thermo module 5 (5b) in the eighth embodiment is set to be greater than the thermo module applied to the seventh embodiment, the cooling efficiency of the cooled elements can be further raised in comparison with the seventh embodiment.

When the cooling efficiency of the cooled elements is thus improved, heat quantity transmitted from the package 26 to the cooled elements is further increased when no heat shield member 8 is arranged. However, in the eighth embodiment, the heat transmission from the package 26 to the cooled elements can be reduced by arranged the heat shield member 8. Accordingly, electric power consumption of the thermo module 5 (5a, 5b) can be greatly reduced in comparison with the case in which no heat shield member 8 is arranged.

Figure 11:
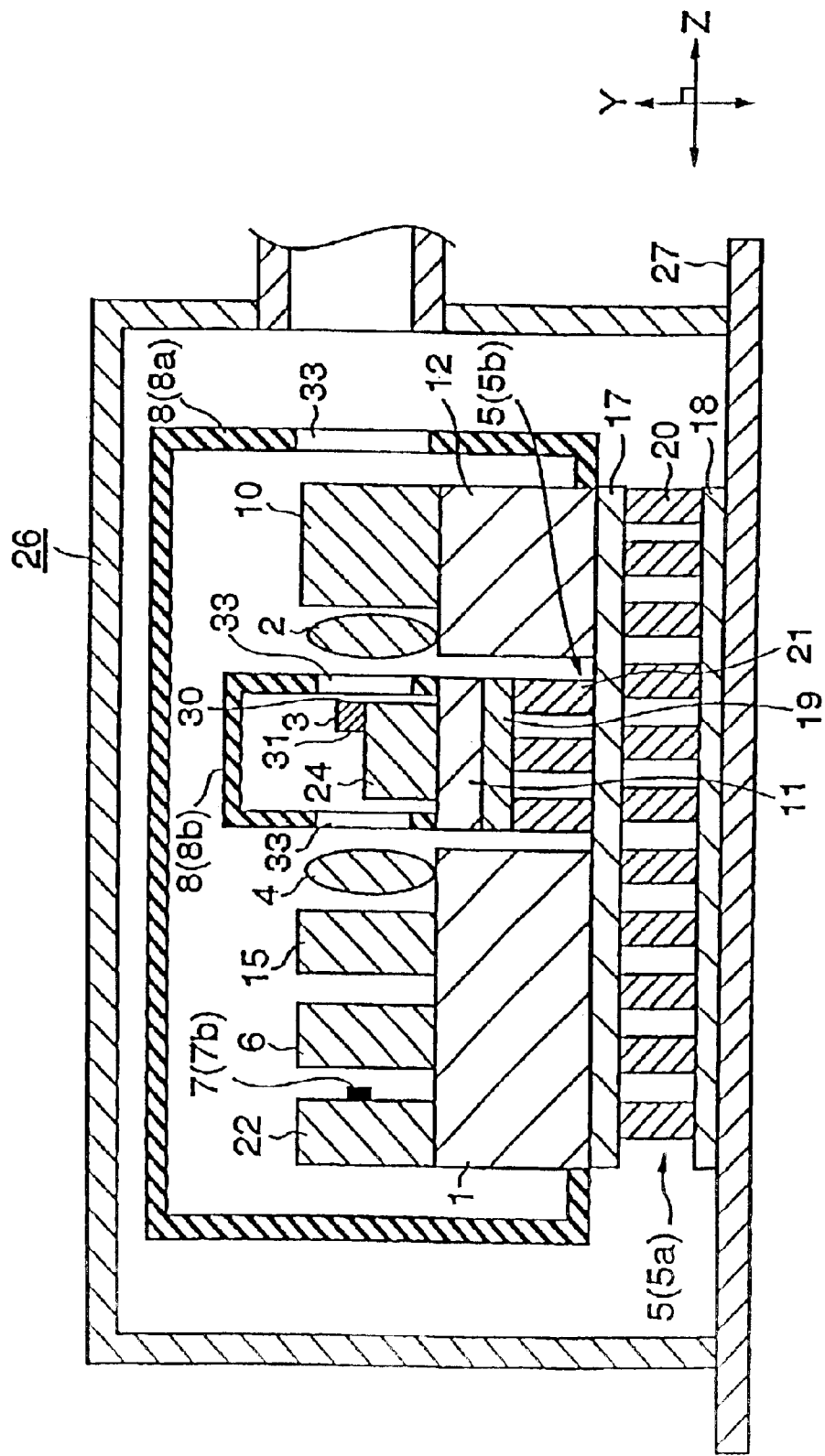
FIG. 11 is an elemental structural view showing a ninth embodiment of the optical module in the present invention by the YZ cross-section.

FIG. 11 shows a ninth embodiment of the optical module in the present invention by a YZ cross-section. In the explanation of the ninth embodiment, the same term portions as each of the above embodiments are designated by the same reference numerals and signs, and their overlapping explanations are omitted.

The ninth embodiment is constructed approximately similarly to the seventh embodiment. The ninth embodiment characteristically differs from the seventh embodiment in that the thermo module 5b is overlapped and formed on a central portion of the thermo module 5a, and an optical isolator 10 is arranged in one end side upper portion of the thermo module 5a through a base 12.

In the ninth embodiment, a lens 2 is arranged on the base 12, and a lens 4 is arranged on a base 1. The heat shield member 8b is arranged in a mode for covering only the laser diode 3, an unillustrated thermistor for LD arranged in the vicinity of the laser diode 3, and a heat sink 24.

In the ninth embodiment, effects similar to those in the seventh embodiment can be obtained. Further, in the ninth embodiment, the area including laser diode 3 can be further uniformed by the heat shield covering only the laser diode 3, the unillustrated thermistor for LD and the heat sink 24 with the heat shield member 8b. Accordingly, in the ninth embodiment, the temperature variable range of the laser diode 3 can be further widened on the low temperature side.

The present invention is not limited to each of the above embodiments, but various embodiment modes can be adopted. For example, in the third embodiment, the wavelength monitor portion 13 is doubly (two layers) covered with the heat shield member 8 (8a, 8b). However, for example, in the third embodiment, only the heat shield member 8 (8b) of a heat conduction material such as a metal may be also arranged without the heat shield member 8 (8a). In this case, the temperature within the heat shield member 8b can be also uniformed.

In each of the above embodiments, the heat shield member 8 is arranged in covering the wavelength monitor portion 13, but may be also arranged in at least one portion of a peripheral area of the wavelength monitor portion 13.

A construction for arranging the heat shield member 8 in a mode for covering a cooled member such as the wavelength monitor portion 13, approximately over the entire surface as widely as possible is certainly desirable in view of the prevention of heat transmission from the package 26 side. However, there is some problem which no cooled member covered widely is allowed widely by the capacity of the package 26 and the size of the built-in cooled member in an assembly process. It is also desirable to prevent the heat transmission as much as possible with respect to the member having large temperature dependency.

Figure 12:
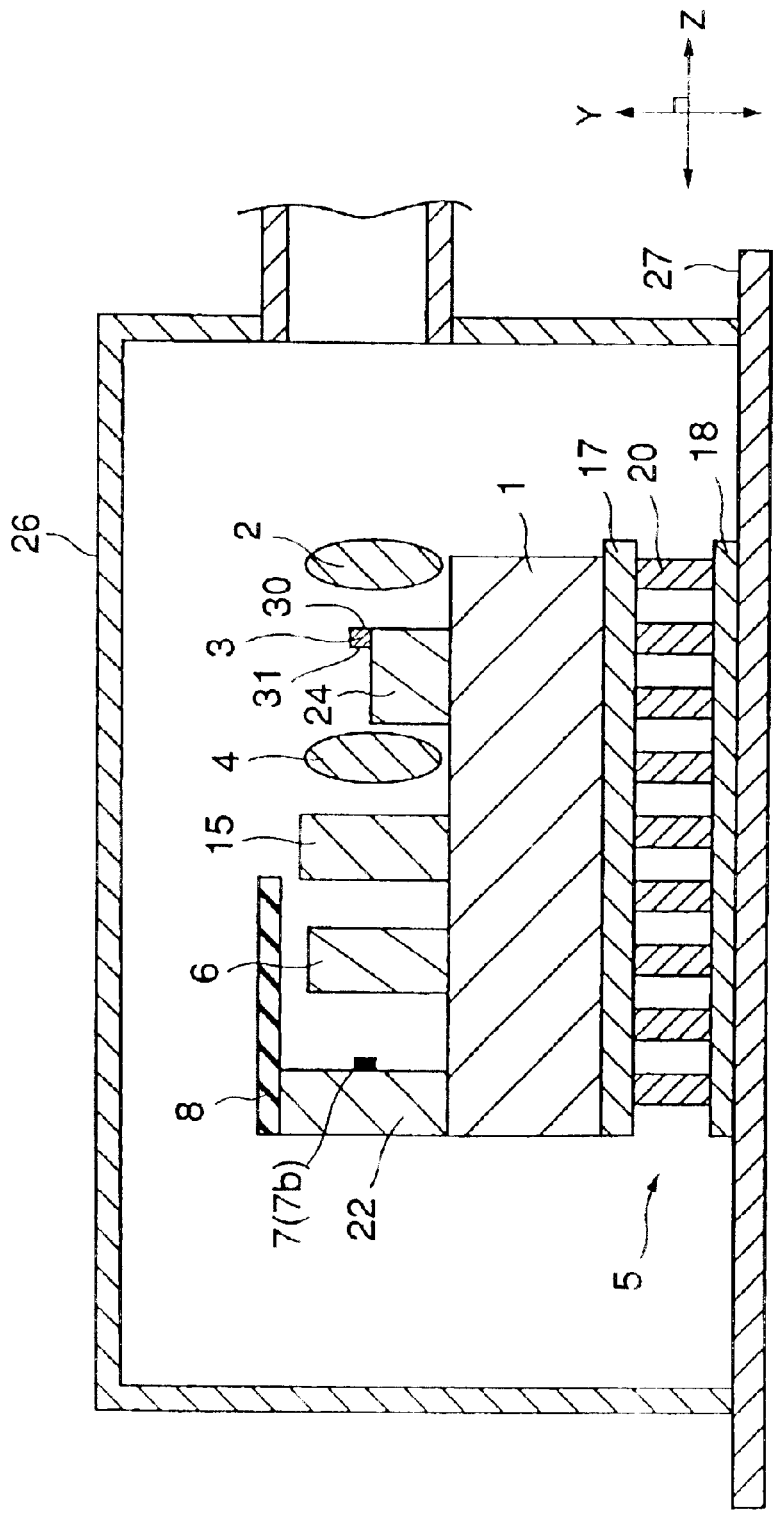
FIG. 12 is an elemental structural view showing another embodiment of the optical module in the present invention by the YZ cross-section.

For example, the heat transmission from the upper face of the package 26 to the wavelength monitor portion 13 is large in the optical module shown in each of the above embodiments. Therefore, as shown in FIG. 12, the heat transmission from the package 26 to the wavelength monitor portion 13 can be also reduced by arranging the heat shield member 8 of a plate shape on the upper side of the wavelength monitor portion 13.

Further, the heat shield member 8 may be also arranged in at least one area (area shown by A, B and C of FIG. 1) between the wavelength monitor portion 13 and the side face of the package 26.

Figures 13A, 13B:
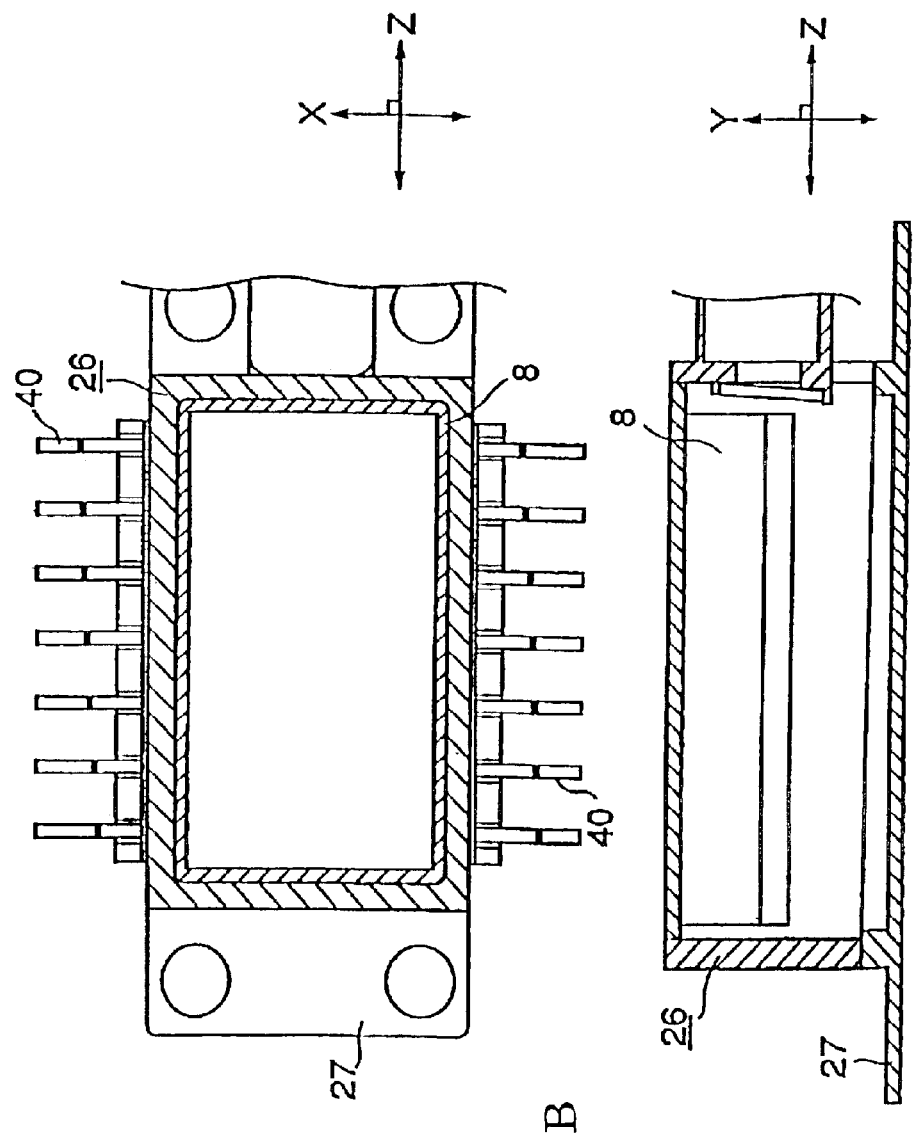
FIG. 13A is an explanatory view showing the arranging construction of a heat shield member in still another embodiment of the optical module in the present invention by the XZ cross-section.
FIG. 13B is a YZ cross-section of the heat shield member arranging construction of the optical module shown in FIG. 13A.

Further, as shown in FIGS. 13A and 13B, the heat shield member 8 may be fixed to an area except for the bottom face and an optical face of the package 26, and unillustrated elements of a wavelength monitor module may be also included in the package 26.

Figure 14A:
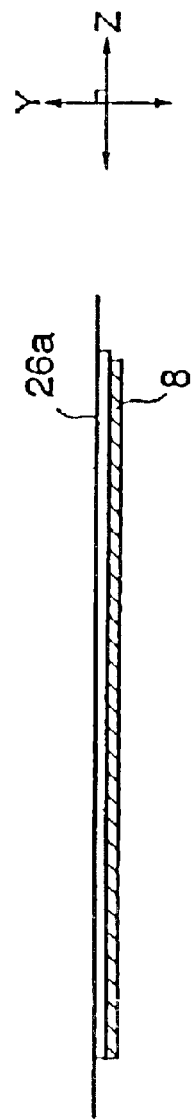
FIG. 14A is an explanatory view showing the construction of a package cover portion in still another embodiment of the optical module in the present invention by the YZ cross section.
Figure 14B:
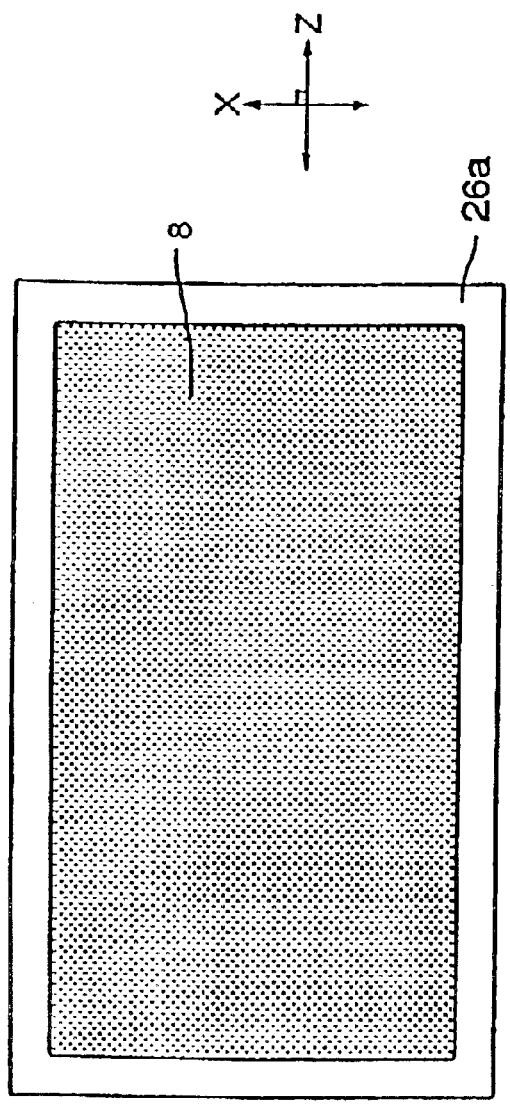
FIG. 14B is an XZ plan view of the package cover portion shown in FIG. 14A.

Further, as shown in FIGS. 14A and 14B, the heat shield member 8 may be also attached to a portion except for a preset seal portion of a cover portion 26a of the package 26.

Figure 15:
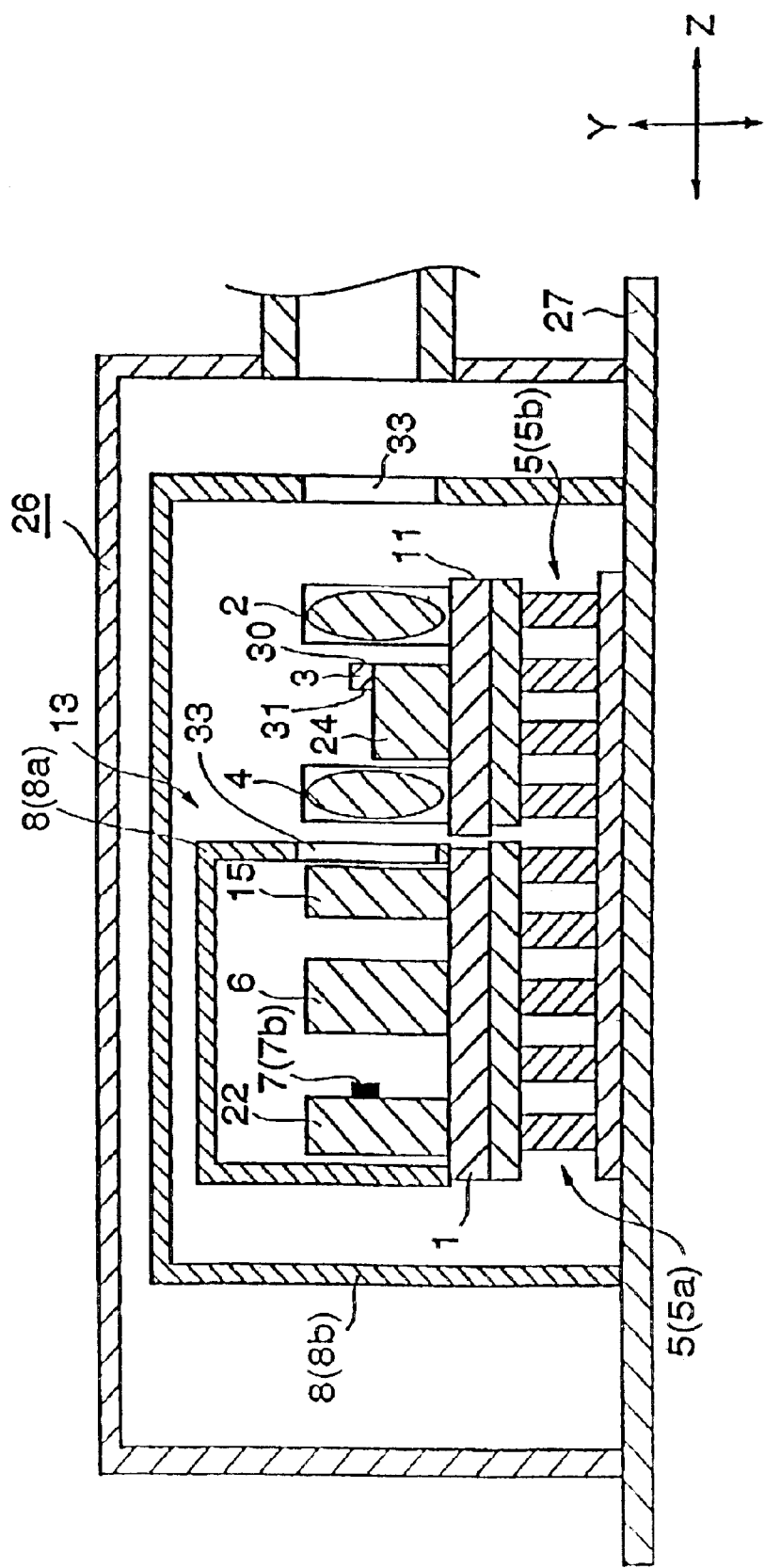
FIG. 15 is an elemental structural view showing still another embodiment of the optical module in the present invention by the YZ cross-section.

Further, as shown in FIG. 15, the heat shield member 8 (8a) for covering the wavelength monitor portion 13, and the heat shield member 8 (8b) for covering the wavelength monitor portion 13, the lenses 2, 4, the laser diode 3 and the heat sink 24 may be also arranged. In the example shown in FIG. 15, the optical isolator 10 may be also arranged.

Thus, the heat transmission from the package 26 to the wavelength monitor portion 13 can be more efficiently reduced by covering the wavelength monitor portion 13 with the heat shield member 8 of two layers or more, and spacing the inside heat shield member 8 (8a) and the outside heat shield member 8 (8b) from each other.

Further, the heat shield member 8 of three layers or more may be also arranged in the optical module of the present invention. When the heat shield member 8 of two layers, three layers or more is arranged in the optical module of the present invention, all the heat shield members 8 may be formed with a heat insulating material, and may be also partially formed with the heat insulating material, and the remaining portions may be also formed with a heat conduction material. All the heat shield members 8 may be also formed with the heat conduction material. It is preferable to form the heat shield member 8 thermally insulated from the package 26 with the heat insulating material or a space.

Figure 16:
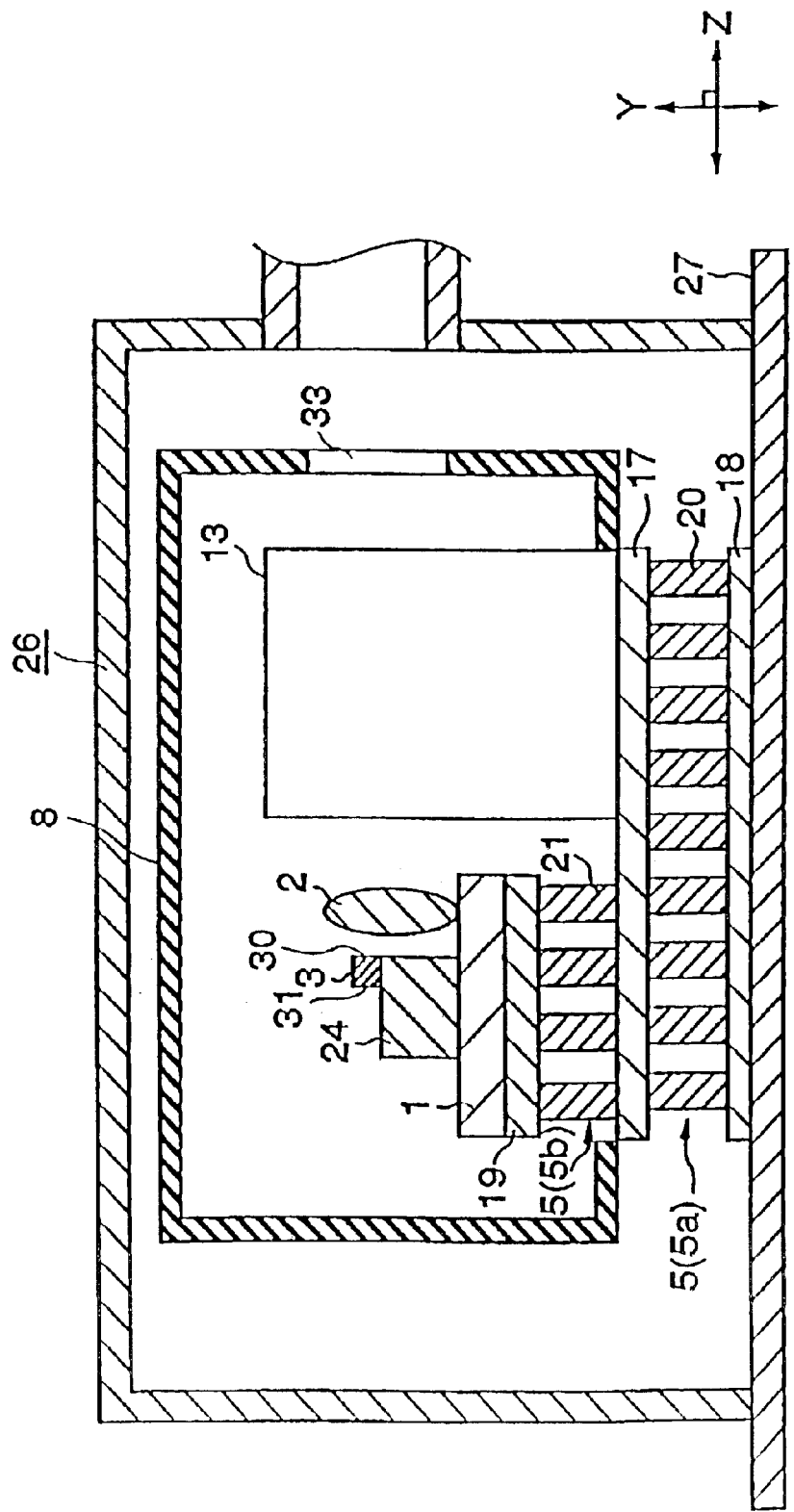
FIG. 16 is an elemental structural view showing still another embodiment of the optical module in the present invention by the YZ cross-section.

Further, in each of the above embodiments, the wavelength monitor portion 13 is arranged on the other end 31 side of the laser diode 3, but may be also arranged on one end 30 side (i.e., the same side as the light transmission side) of the laser diode 3 as shown in e.g., FIG. 16. In this case, an optical divider divides the laser beam outputted from the laser diode and one portion of the laser beam is used for the wavelength monitor, and the other portions are coupled to the optical fiber.

Figure 19:
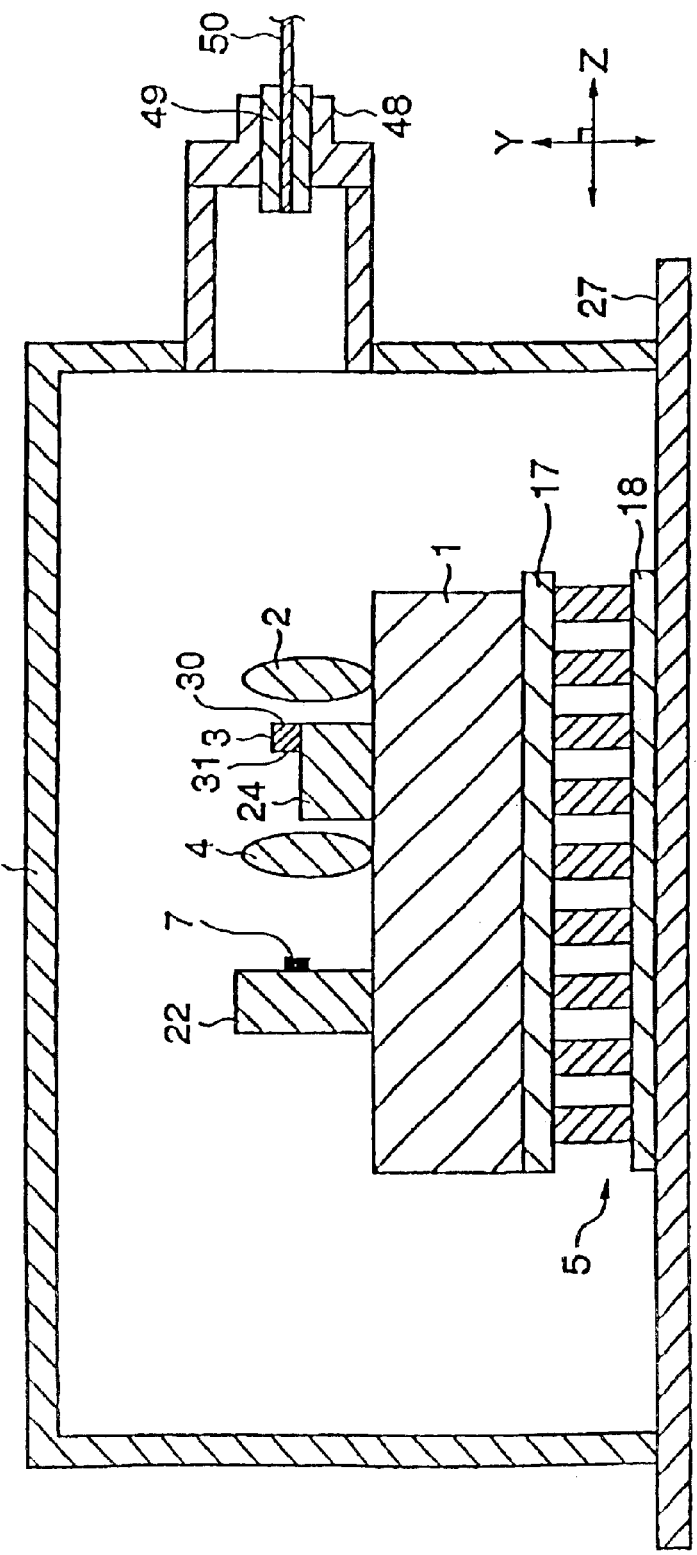
FIG. 19 is an explanatory view showing one example of a conventional optical module by the YZ cross-section along an optical axis.
Figure 20:
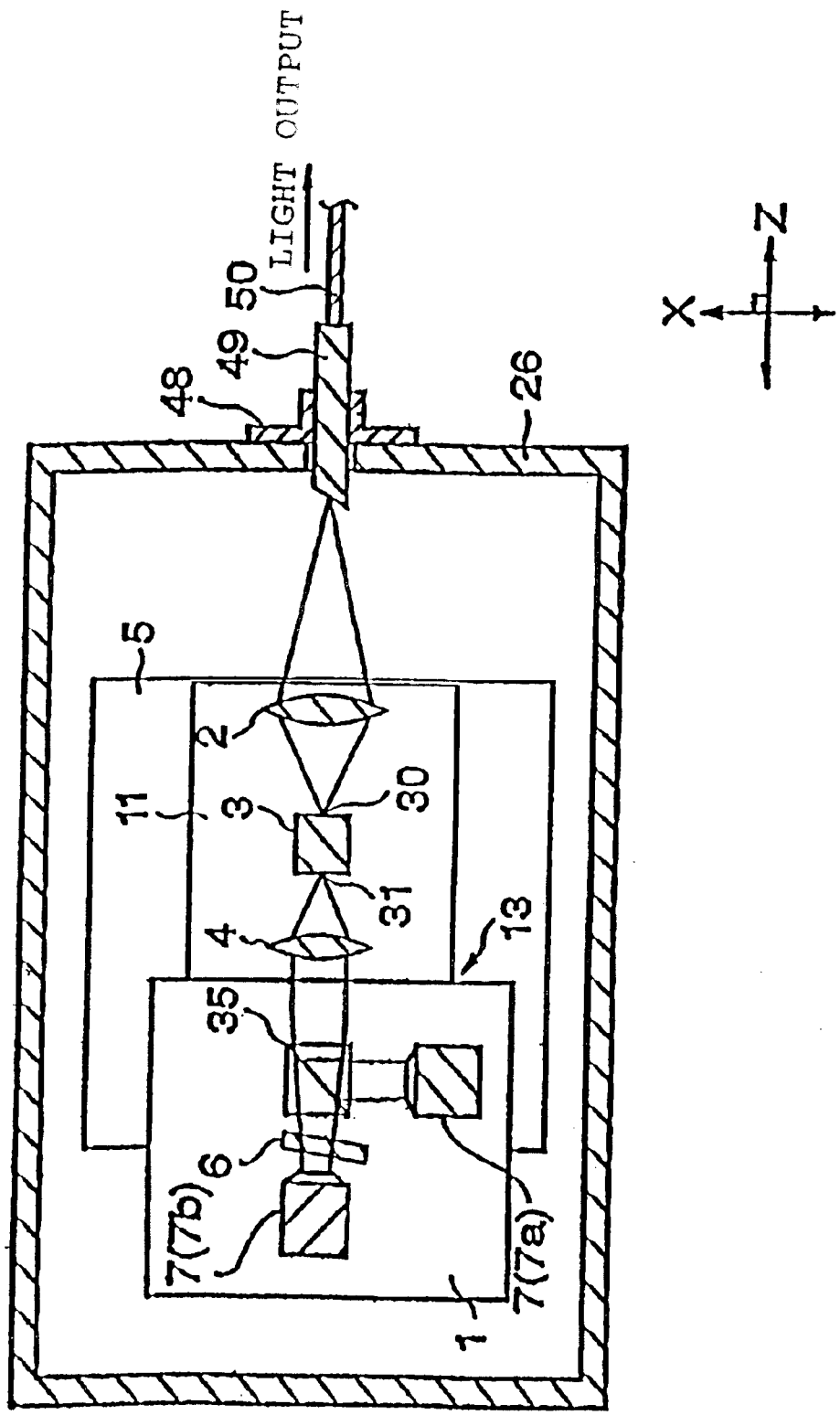
FIG. 20 is an explanatory view showing another example of the conventional optical module by the XZ cross-section along the optical axis.

When the monitor portion 13 is arranged on the other end 31 side of the laser diode 3 as in each of the above embodiments, the construction of the monitor portion 13 is not particularly limited. For example, the wavelength of the laser diode 3 may be monitored as the monitor portion 13 having a wavelength monitor construction arranged in an example shown in FIG. 20. Further, the monitor portion of a simple construction for monitoring output light intensity of the laser diode 3 by the photodiode 7 may be also arranged as in the conventional example shown in FIG. 19.

Figure 17:
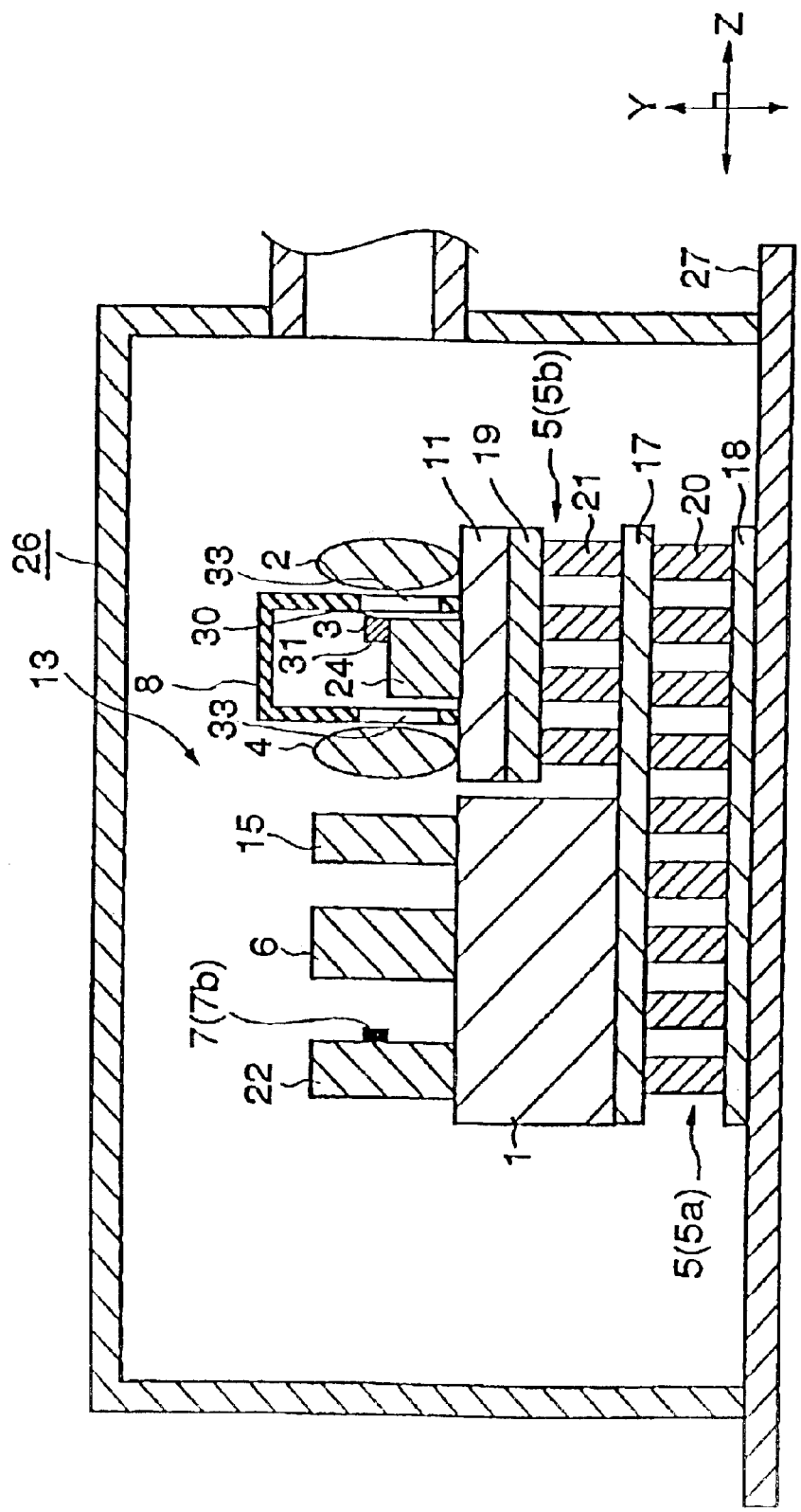
FIG. 17 is an elemental structural view showing still another embodiment of the optical module in the present invention by the YZ cross-section.

Further, as shown in FIG. 17, the heat shield member 8 may be also set to have a construction for covering only the vicinity of the laser diode 3. In this construction, a space for arranging the heat shield member 8 is small and the heat shield member 8 is easily stored into the package conventionally used.

Figure 18:
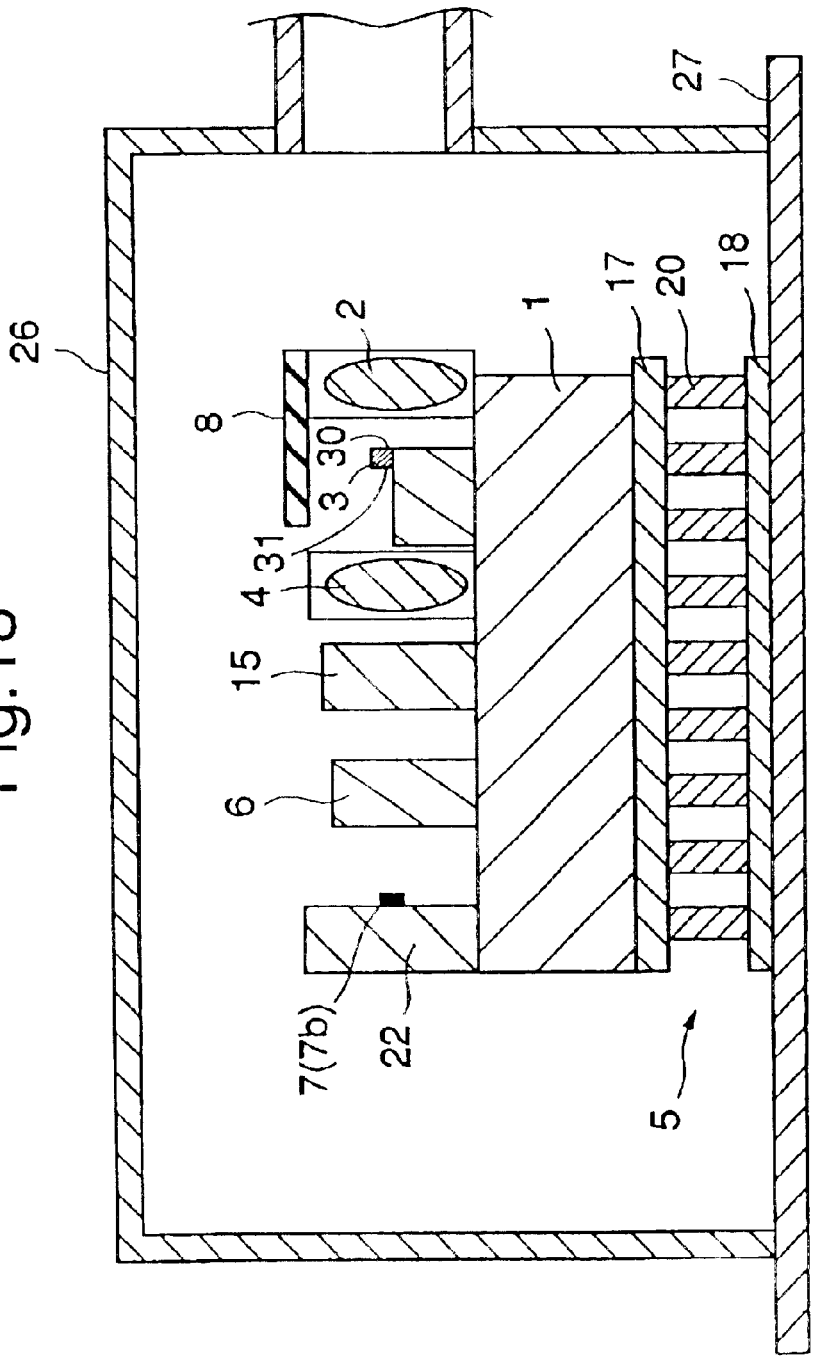
FIG. 18 is an elemental structural view showing still another embodiment of the optical module in the present invention by the YZ cross-section.

Further, as shown in FIG. 18, a construction for fixing the heat shield member 8 of a plate shape to a lens holder for holding the lens 2, and reducing heat input to the laser diode 3 may be also used.

Further, the cooled elements arranged in the optical module of the present invention are not limited to the construction arranged in each of the above embodiments.

Further, the optical module of the present invention is not necessarily limited to the laser module shown in each of the above examples, but may be also available for the wavelength monitor module arranged separately from the laser diode 3. Namely, in this case, the optical module has at least the optical wavelength selecting transmission filter and a light receiving device for receiving transmission light of this wavelength selecting transmission filter, and these elements are mounted on a temperature adjuster in a package. This optical module monitors the wavelength of laser beam inputted through an optical fiber.

What is claimed is:

1. An optical module comprising:
an optical component having a temperature dependent property;
a temperature adjuster for adjusting the temperature of the optical component;
package for including the temperature adjuster and the optical component; and
a heat shield member arranged in at least one portion of a peripheral are of said optical component and reducing heat transmission from said package to said optical component, wherein
the optical component having the temperature dependent property is an optical filter positioned to receive and filter at least a component of the laser beam and the filtered light through the optical filter is received by a light receiving device to monitor a wavelength of the laser beam and
the heat shield member is fixed onto a temperature adjuster, not to the thermally contact with the package.

2. An optical module comprising:
an optical component having a temperature dependent property;
a temperature adjuster for adjusting the temperature of the optical component;
a package for including the temperature adjuster and the optical component; and
a heat shield member arranged in at least one portion of a peripheral area of said optical component and reducing heat transmission from said package to said optical component, wherein
the optical component having the temperature dependent property is optical filter positioned to receive and filter at least a component of the laser beam and the filtered light through the optical filter is received by a light receiving device to monitor a wavelength of the laser beam and
at least one portion of the heat shield members is arranged in two layer or more.

3. An optical module according to claim 2, wherein
the inside and outside heat shield members of the heat shield members arranged in the two layers or more are spaced from each other.

4. An optical module comprising:
an optical component having a temperature dependent property;
a temperature adjuster for adjusting the temperature of the optical component;
a package for including the temperature adjuster and the optical component; and
a heat shield member arranged in at least one portion of a peripheral area of said optical component and reducing heat transmission from said package to said optical component, wherein
the optical component having the temperature dependent property is an optical filter positioned to receive and filter at least a component of the laser beam and the filtered light through the optical filter is received by a light receiving device to monitor a wavelength of the laser beam and
the heat shield members of at least one layer are formed with a metal.

5. An optical module comprising:
an optical component having a temperature dependent property;
a temperature adjuster for adjusting the temperature of the optical component;
a package for including the temperature adjuster and the optical component: and
a heat shield member arranged in at least one portion of a peripheral area of said optical component and reducing heat transmission from said package to said optical component, wherein
the optical component having the temperature dependent property is optical filter positioned to receive and filter at least a component of the laser beam and the filtered light through the optical filter is received by a light receiving device to monitor a wavelength of the laser beam and
the heat shield member is fixed onto the package so as not to thermally contact with the temperature adjuster.

6. An optical module comprising:

a package;

a temperature adjuster included in the package; and one or more cooled elements mounted on the temperature adjuster and cooled by the temperature adjuster;

wherein at least one of the cooled elements is a laser diode; and a heat shield member is arranged between said package and said cooled element so as not to thermally contact with said package to reduce the heat transmission from said package to said cooled element.

7. An optical module according to claim 6, wherein at least one portion of the heat shield member thermally contacts with at least one portion of the cooled elements or the cooling portion of the temperature adjuster.

8. An optical module according to claim 6, wherein plural temperature adjusters are arranged in a cascade with two stages or more.

9. An optical module according to claim 8, wherein at least one portion of the heat shield member thermally contact with a least one portion of the cooled elements or a cooling portion of the uppermost temperature adjuster.

10. An optical module according to claim 8, wherein the heat shield member is arranged in thermal contact with the temperature adjuster of a lower layer and is also arranged in covering the temperature adjuster of an upper layer and its cooled element.

11. An optical module according to claim 10, wherein the heat shield member is fixed to a holder for fixing the optical component mounted on the temperature adjuster.

12. An optical module according to claim 6, wherein plural heat shield members are arranged in covering the cooled element doubly or more.

13. An optical module according to claim 12, wherein the innermost heat shield member among the double or more plural heat shield members covers a laser diode.

14. An optical module according to claim 6, wherein the heat shield member of at least one layer is formed with a metal.

15. An optical module comprising:

an optical component having a temperature dependent property;

a temperature adjuster for adjusting the temperature of the optical component;

a package for storing the optical component and the temperature adjuster; and a heat shield member arranged between the package and the optical component;

wherein the heat shield member thermally contacts with said temperature adjuster wherein the heat shield member and the temperature adjuster are fixed by a thermal conducting material.

* * * * *